United States Patent [19]

Ogawa et al.

[11] Patent Number: 5,481,484
[45] Date of Patent: Jan. 2, 1996

[54] MIXED MODE SIMULATION METHOD AND SIMULATOR

[75] Inventors: Munehiro Ogawa, deceased, late of Kumamoto, Japan, by Yoshihiro Ogawa, Mieko Ogawa, heirs; Masato Iwabuchi, Akishima, Japan; Hitoshi Sugihara, Koganei, Japan; Saburo Hojo, Takasaki, Japan; Masami Kinoshita, Hidaka, Japan; Osamu Yamashiro, Tokorozawa, Japan; Goichi Yokomizo, Tokyo, Japan; Mikako Miyama, Hachioji, Japan

[73] Assignee: Hitachi, Ltd., Tokyo, Japan

[21] Appl. No.: 953,533

[22] Filed: Sep. 28, 1992

[30] Foreign Application Priority Data

Oct. 9, 1991 [JP] Japan ................................. 3-290597
Feb. 5, 1992 [JP] Japan ................................. 4-054215

[51] Int. Cl.⁶ ........................................ G06J 1/00
[52] U.S. Cl. ..................... 364/578; 364/488; 364/489; 364/490; 364/491
[58] Field of Search .................... 364/490, 488, 364/489, 578, 900

[56] References Cited

U.S. PATENT DOCUMENTS

| | | | |
|---|---|---|---|
| 4,792,913 | 12/1988 | Buckland et al. | 364/602 |
| 4,807,168 | 2/1989 | Moopenn et al. | 364/602 |
| 4,866,663 | 9/1989 | Griffin | 364/900 |
| 4,985,860 | 1/1991 | Vlach | 364/578 |
| 5,084,824 | 1/1992 | Lam et al. | 364/490 |
| 5,105,373 | 4/1992 | Rumsey et al. | 364/578 |
| 5,297,066 | 3/1994 | Mayes | 364/578 |
| 5,325,309 | 6/1994 | Halaviati et al. | 364/488 |
| 5,392,227 | 2/1995 | Hiserote | 364/578 |
| 5,394,346 | 2/1995 | Milsom | 364/578 |

FOREIGN PATENT DOCUMENTS

| | | |
|---|---|---|
| 1-292482 | 11/1989 | Japan . |
| 2-220144 | 9/1990 | Japan . |

OTHER PUBLICATIONS

Thomas H. Morrin, "Mixed–Mode Simulation for Time Domain Fault Analysis", IEEE, 1989, pp. 231–241.

Francis C. Wang, "A Simulation Based Strategy for Mixed Mole Testing", IEEE, 1992, pp. 363–367.

Lee et al., "A Mixed Mode Analog Digital Simulation Methodology for Full Custom Designs", IEEE, 1988, pp. 3.5.1–3.5.4.

Acuna, Eduardo L., et al., "Simulation Techniques for Mixed Analog/Digital Circuits", IEEE Journal of Solid–State Circuits, vol. 25, No. 2, Apr. 1990, pp. 353–363, (English).

"Principles PLE of CMOS VLSI: A System Perspective", p. 255 6.4.2.

"Spice 2: A Computer Program to Simulate Semiconductor Circuits", L. W. Nagel; UCB/ERL M520, 9 May 1975.

"Design of VLSI (Circuit and Layout)", Iwanami Lecture Microelectronics, vol. 3, published by Kabushiki Kaisha Iwanami Shoten on Sep. 22, 1987, Section 3.

(List continued on next page.)

Primary Examiner—Kevin J. Teska
Assistant Examiner—Thai Phan
Attorney, Agent, or Firm—Fay, Sharpe, Beall, Fagan, Minnich & McKee

[57] ABSTRACT

A mixed mode simulation method and apparatus are provided for highly accurately simulating the total characteristics of a digital analyzed circuit portion and an analog analyzed circuit portion, which are both subjected to mixed mode simulation, in consideration of the influence exerted on the analog analyzed circuit portion by a current consumed by the digital analyzed circuit portion. More particularly, a current value of an equivalent circuit for current calculation modeled for providing the analog analyzed circuit portion with a current generated due to an operating state of the digital analyzed circuit portion realized by logic simulation is determined in synchronism with the logic simulation, and the equivalent circuit for current calculation derived thereby is composed with the analog analyzed circuit portion, and this composite circuit is subjected to circuit simulation.

17 Claims, 32 Drawing Sheets

OTHER PUBLICATIONS

"Principles PLE of CMOS VLSI Design, A System Perspective" p. 255.

Information Processing Series No. 5 entitled "CAD for Logic Devices", published by Institute of Information Processing of Japan.

Acuna et al., "Simulation Techniques for Mixed Analog/Digital Circuits", IEEE Journal of Solid–State Circuits, vol. 25, No. 2, Apr., 1990, pp. 353–362.

L. W. Nagal, "SPICE 2: A computer program to simulate semiconductor circuit", Electron, Res. Lab., Univ. of Calif., Berkeley, Rep. ERL–M500, May, 1975.

TIME

FIG. 8

$$\begin{bmatrix} a_{11} & a_{12} & a_{13} & a_{14} & a_{15} \\ a_{21} & a_{22} & a_{23} & a_{24} & a_{25} \\ a_{31} & a_{32} & a_{33} & a_{34} & a_{35} \\ a_{41} & a_{42} & a_{43} & a_{44} & a_{45} \\ a_{51} & a_{52} & a_{53} & a_{54} & a_{55} \end{bmatrix} \begin{bmatrix} V_1 \\ V_2 \\ V_3 \\ V_4 \\ V_5 \end{bmatrix} = \begin{bmatrix} b_1 \\ b_2 \\ b_3 \\ b_4 \\ b_5 \end{bmatrix} \cdots \text{ORDINARY FORM}$$

$$\begin{bmatrix} 11 & 8 & 0 & 0 & 0 \\ 0 & -2 & 6 & 0 & -6 \\ -4 & 0 & 1 & -1 & -3 \\ 0 & 0 & 0 & 5 & 0 \\ 0 & -5 & 0 & 0 & 7 \end{bmatrix} \begin{bmatrix} V_1 \\ V_2 \\ V_3 \\ V_4 \\ V_5 \end{bmatrix} = \begin{bmatrix} 1 \\ 3 \\ 5 \\ 2 \\ 4 \end{bmatrix} \cdots \text{SPARSE MATRIX}$$

FIG. 19A
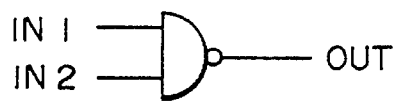
FIG. 19B          FIG. 19C
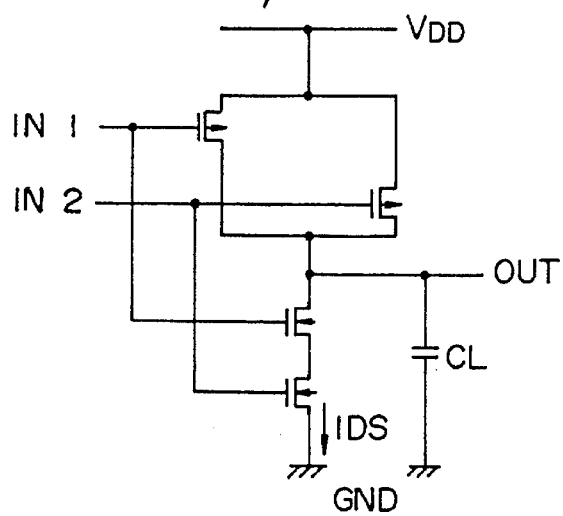
FIG. 19D
| A \ B | 00 | 01 | 10 | 11 |
|---|---|---|---|---|
| 00 | — | — | — | GND |
| 01 | — | — | — | GND |
| 10 | — | — | — | GND |
| 11 | VDD | VDD | VDD | — |

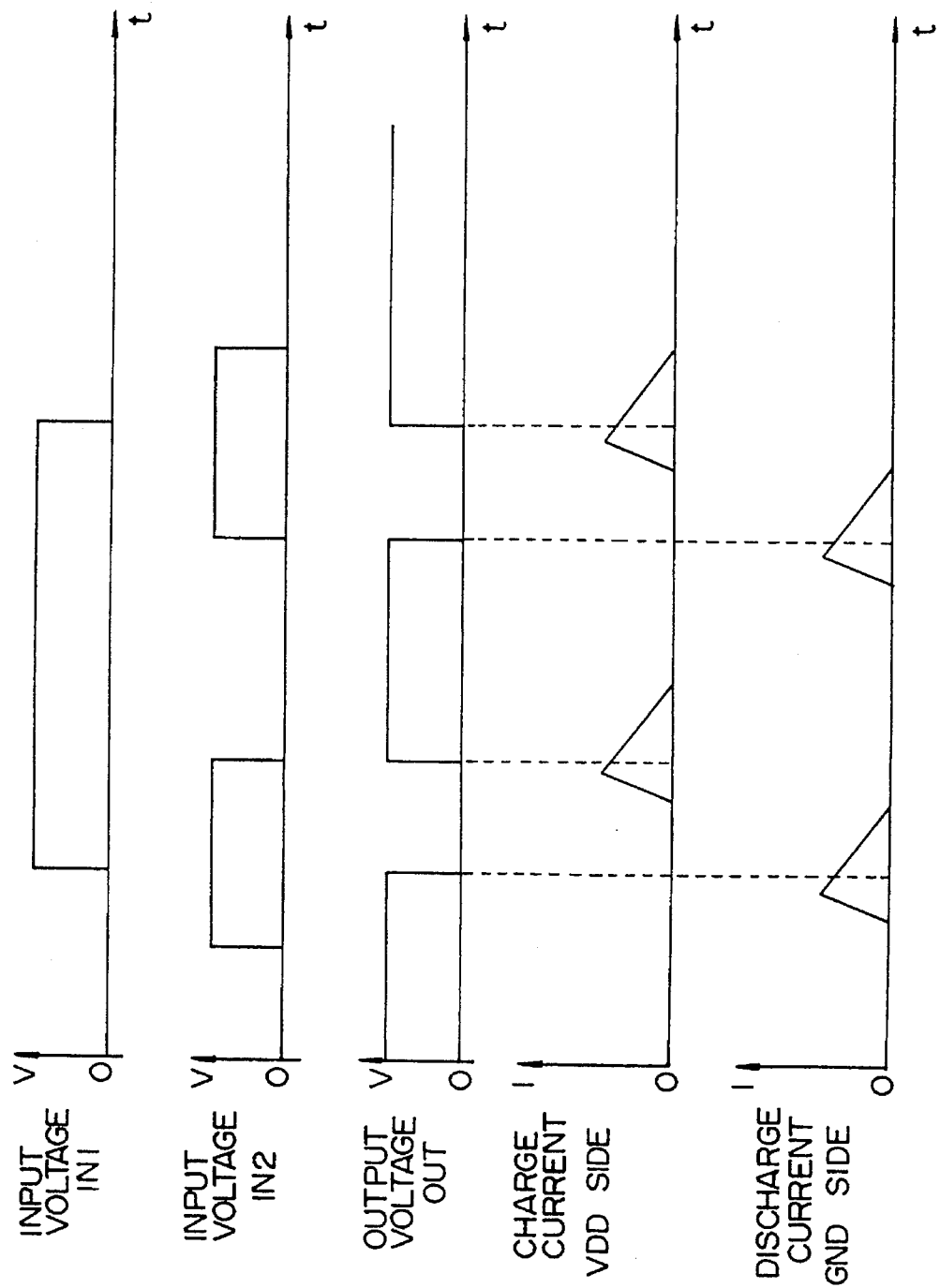

○ DETERMINED ANALYSIS POINT
(A NUMBER IN CIRCLE REPRESENTS THE ANALYSIS ORDER)

✽ D/A EVENT REGISTERED POINT

• ANALYSIS SCHEDULED POINT OF CIRCUIT SIMULATOR

○ DETERMINED ANALYSIS POINT
  (A NUMBER IN CIRCLE REPRESENTS
  THE ANALYSIS ORDER)

✳ D/A EVENT REGISTERED POINT

● ANALYSIS SCHEDULED POINT OF
  CIRCUIT SIMULATOR

MIXED MODE SIMULATION METHOD AND SIMULATOR

BACKGROUND OF THE INVENTION

The present invention relates to mixed module simulation, and more particularly to a mixed mode simulation method and apparatus having a function of calculating a current which may fluctuates due to the operation of a digital circuit realized by logic simulation, wherein logic simulation and circuit simulation are integrated with each other.

Simulation for ICs (Integrated Circuits) may be classified into circuit simulation and logic simulation. The circuit simulation, which employs a differential equation or a circuit equation, treats a circuit to be analyzed as an analog circuit and analyzes it to pursue and evaluate detailed electrical operations of a target circuit. The analysis is performed at a variable time step. The logic simulation, also known as event-driven simulation, treats a circuit to be analyzed as a digital circuit and searches for the behavior of the logic operation of the circuit. The logic simulation employs an event-driven method to perform analysis at equal time intervals using a constant unit time (analysis time unit). The unit time here refers to the resolution of analysis in terms of time. Mixed mode simulation, which is a combination of circuit simulation and logic simulation, has been developed for simulating LSIs (Large Scale Integrated Circuits). In the mixed mode simulation, a circuit portion of a circuit subjected to circuit simulation and therefore treated as an analog circuit is referred to as "an analog analyzed circuit portion" ("an analog simulated circuit"), while a circuit portion subjected to logic simulation and therefore treated as a digital circuit is referred to as "a digital analyzed circuit portion" ("a digital simulated circuit"). Synchronization is established between both simulations in order to transfer signals between the analog analyzed circuit portion and the digital analyzed circuit portion.

Examples of documents which describe simulation for verifying the operation of a mixed analog/digital LSI may be JP-A-1-292482 (Fujitsu) and JP-A-2-220144 (Ricoh). JP-A-1-292482 divides a mixed analog/digital circuit into blocks and executes simulation in accordance with each of the divided circuits for the purpose of minimizing overhead for interfacing the analog portion and the digital portion. JP-A-2-220144 enables simulation to be collectively executed for both of an analog circuit and a digital circuit which are connected with each other. JP-A-2-220144 further aims at reducing a processing time required for simulation of a digital analyzed circuit portion in a mixed digital/analog circuit by getting rid of simulation at transistor level for designated blocks. Further, "Design of VLSI I (Circuit and Layout)", Iwanami Lecture Microelectronics Vol. 3 published by Kabushiki Kaisha Iwanami Shoten on Sep. 22, 1987, Section 3, and "Principles PLE of CMOS VLSI Design a System Perspective" P255—refer to simulation for electronic circuit (analog simulation). Also, Information Processing Series No. 5 entitled "CAD for Logic Devices" published by Institute of Information Processing of Japan, Section 2 refers to simulation for logic gates. Acuna et al "Simulation Techniques for Mixed Analog/Digital Circuits", IEEE Journal of Solid-State Circuits, Vol. 25, No. 2, April, 1990, pp. 353–362 describes techniques used in a simulator called iSPLICE3 for analysis of mixed analog/digital circuits which combines circuit, switch-level timing, and logic simulation models using event-driven selective-trace techniques.

Conventionally, as to simulation for mixed analog/digital LSIs, consideration has been made to a voltage level of signals transferred between an analog analyzed circuit and a digital analyzed circuit. However, a current consumed by the digital analyzed circuit has not been considered or such consideration has been regarded as being unnecessary.

Nevertheless, as a result of an investigation on a current consumed by a digital analyzed circuit, which has been made by the present inventors, from the fact that a power supply line is commonly used by a digital analyzed circuit and an analog analyzed circuit in a mixed analog/digital LSI and a resistance of the power supply line is not zero, it is predicted with high possibility that fluctuation in a current consumed by a digital analyzed circuit affects an analog analyzed circuit. It has therefore been found that, with a conventional simulation method which does not consider a current consumed by a digital analyzed circuit, the total operation characteristics of a digital analyzed circuit and an analog analyzed circuit cannot be simulated in a high accuracy. Incidentally, a logic simulator may be additionally provided with a current calculation function. However, even with such an extended function, as long as the calculation is made only for a digital analyzed circuit, it is apparent that the total characteristics of a digital analyzed circuit and an analog analyzed circuit cannot be simulated.

SUMMARY OF THE INVENTION

It is an object of the present invention to provide a technique which enables highly accurate simulation for the total characteristics of an analog analyzed circuit and a digital analyzed circuit in a mixed analog/digital LSI.

It is another object of the present invention to provide a simulation technique which is capable of readily evaluating fluctuation in a voltage or a current which may arise in a power supply system due to an operating state of a digital analyzed circuit as well as evaluating a malfunction of an analog analyzed circuit caused by voltage or current fluctuation in the power supply system.

It is a further object of the present invention to provide a technique which is capable of calculating a current flowing through a digital analyzed circuit using a circuit simulator.

The above and other objects and novel features of the present invention will become apparent from the description of the preferred embodiments and accompanying drawings.

According to a feature of the present invention, a mixed mode simulation method for enabling verification to be made for the influence which is exerted on an analogy analyzed circuit portion realized by circuit simulation by a state of a digital analyzed circuit portion realized by logic simulation, comprises the first step of determining a state of an analog component depending on an operating state of the digital analyzed circuit portion realized by the logic simulation in synchronism with the logic simulation, and the second step of including the analog component determined by the first step in a circuit subjected to circuit simulation as an equivalent circuit representative thereof and executing circuit simulation for this circuit.

The analog component may be provided in the form of an equivalent circuit for current calculation which is modeled for applying the analog analyzed circuit portion with a current which is generated in accordance with an operating state of the digital analyzed circuit portion. This equivalent circuit includes a current source component. In this event, the first step for determining a state of the analog component calculates a current value for the current source component included in the equivalent circuit for current calculation. In the second step, circuit simulation is to be executed for a composite circuit composed of the equivalent circuit for current calculation with a determined current value of the current source component and the analog analyzed circuit portion which are coupled through a power supply wiring component.

In mixed mode simulation, synchronization is established between an analog analyzed circuit portion and a digital analyzed circuit portion for transferring signals between the analog analyzed circuit portion and the digital analyzed circuit portion. When a signal is transferred in one way during a predetermined simulation period, synchronization between the two circuit portions can be controlled by a procedure wherein simulation is executed first for an analyzed circuit portion serving as a signal source and then simulation is executed for the other analyzed circuit portion on the signal receiving side. On the other hand, if a signal is transferred in feedback loop in a predetermined simulation period, since a simulation state of one analyzed circuit portion affects a simulation state of the other analyzed circuit and vice versa, a control must be performed so as to sequentially synchronize circuit simulation with logic simulation in accordance with an advancing situation of both simulation. For the synchronization control in such a case, an analysis switching time is set based on the earlier one of a next scheduled time at which a signal is transferred from an analyzed circuit portion subjected to logic simulation to an analyzed circuit portion subjected to circuit simulation and a next scheduled time at which circuit simulation is to be next executed. Then, control information is generated for an equivalent circuit for calculating a current through the digital analyzed circuit portion on the basis of logic simulation and an operating state of the digital analyzed circuit portion realized by the logic simulation until the set analysis switching time. Circuit simulation is executed for a composite circuit composed of the equivalent circuit for current calculation fed with the control information and the analog analyzed circuit portion. These processings are repeated to synchronously advance circuit simulation and logic simulation.

If a time earlier than the analysis switching time is present as a next scheduled time at which a signal is to be transferred from a circuit portion subjected to logic simulation to a circuit portion subjected to circuit simulation presents a time earlier than the analysis switching time while executing the logic simulation, the newly generated scheduled time is set as a new analysis switching time.

Changing a viewpoint with respect to the generation of the equivalent circuit for current calculation, the foregoing simulation method may be replaced with a procedure wherein a logic model of a logic element whose output logic value is unitarily determined by a logic value inputted thereto and a current model which represents a state transition causing a change in a current flowing through the logic model, with a state variable being either of or a combination of the input logic value and the output logic value, are assigned to a logic element in a logic analyzed circuit portion, logic simulation is executed based on the logic model assigned to the logic element, the value of a transient current generated by a change in the output of the logic element is calculated based on the current model assigned to the logic element in synchronism with the logic simulation, and the transient current value is provided to a power supply net which models a power supply wiring system to which the logic element is connected. Then, the analog analyzed circuit portion subjected to circuit simulation is composed with the power supply net, and circuit simulation is executed for the composite circuit, thereby making it possible to highly accurately verify the influence exerted on the analog analyzed circuit portion by a state of the digital analyzed circuit portion realized by the logic simulation. For relatively readily calculating a transient current, a waveform approximated by a polygonal line or a curve may be utilized to calculate the transient current. Also, to suppress an extreme increase in a circuit simulation time caused by the addition of the transient current to elements subjected to circuit simulation through the power supply net, transient currents above a predetermined threshold value alone are applied to the power supply net so as to neglect fluctuation in the power supply considered to exert substantially no influence, thereby making it possible to reduce burdens of circuit simulation.

According to the foregoing means, by virtue of the analog simulation executed for the composite circuit composed of the equivalent circuit for current calculation for deriving the analog component formed by modeling a current flowing through the digital analyzed circuit portion and the analog analyzed circuit portion, fluctuation in a current consumed by the digital analyzed circuit portion acts to reflect to the analog analyzed circuit portion, which enables simulation for the total characteristics of the digital analyzed circuit portion and the analog analyzed circuit portion as well as verification on the influence exerted on the analog analyzed circuit portion by power supply noise generated by the operation of the digital analyzed circuit portion in a mixed analog/digital circuit. Further, a calculation of a current through a digital circuit is realized by a circuit simulator based on the modeled equivalent circuit.

Further, the employment of a synchronization control method wherein time at which a logic simulator is synchronized with a circuit simulator is determined depending on a time at which a logic signal value changes at a node through which a signal is transferred from the digital analyzed circuit portion to the analog analyzed circuit portion and a next scheduled time at which the circuit simulator performs analysis, and simulation is advanced such that logic simulation precedes circuit simulation, results in eliminating the necessity of using a narrow time step, realizing efficient mixed mode simulation, preventing back track from arising, and accordingly reducing useless calculations.

BRIEF DESCRIPTION OF THE DRAWINGS

FIG. 8 is a diagram for explaining an ordinary circuit equation and a sparse matrix as an example of the data structure used for executing circuit simulation;

FIGS. 19A–19D are diagrams for explaining a logic model and an example of a current model when a NAND gate is selected as an example of a logic gate;

FIG. 20 is a diagram for explaining an event of a logic element and current waveforms generated from the logic element by that event;

DETAILED DESCRIPTION OF THE PREFERRED EMBODIMENTS

The present invention will hereinafter be described with reference to embodiments which may be roughly classified into a first embodiment shown in FIGS. 1–29 and a second embodiment typically shown in FIGS. 30–34.

Figure 1:
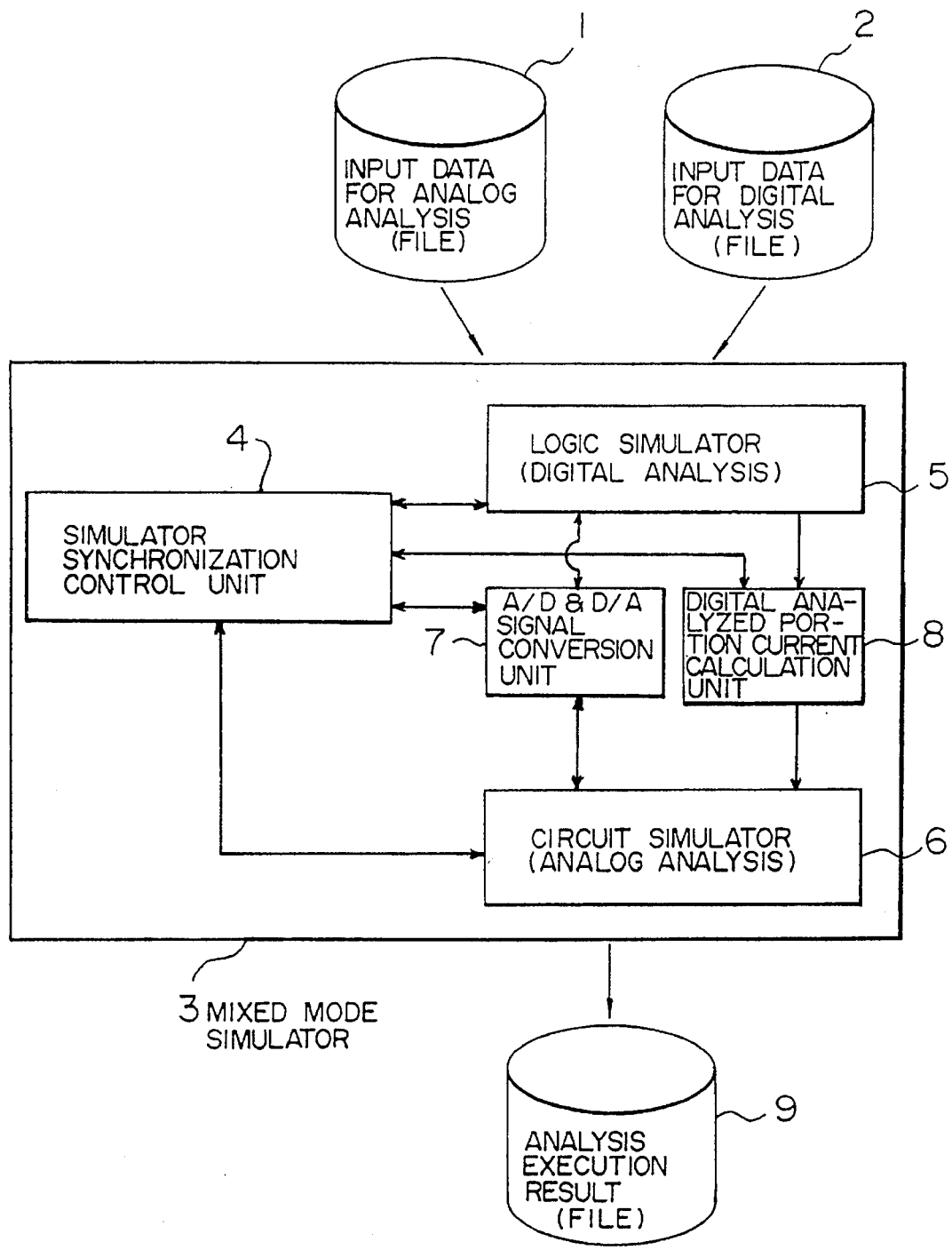
FIG. 1 is a block diagram illustrating the configuration of a system according to an embodiment of a mixed mode simulator which embodies the present invention.

FIG. 1 is a diagram illustrating the configuration of a system including a mixed mode simulator according to a first embodiment to which the present invention is applied.

A mixed mode simulator 3 comprises a logic simulator 5 for simulating a digital analyzed circuit portion; a circuit simulator 6 for simulating an analog analyzed circuit portion; a synchronization control unit 4 for controlling synchronization between logic simulation and circuit simulation; a signal conversion unit 7 for performing A/D signal conversion and D/A signal conversion; and a current calculation unit 8 for calculating a current in a digital analyzed circuit portion in conformity with the teaching of the present invention.

Inputs to the mixed mode simulator 3 include input data 2 for digital analysis which describes a circuit subjected to analysis at logical level and input data 1 for analog analysis which describes a circuit subjected to analysis at an analog analysis circuit level. The input data 2 for digital analysis is a description which indicates functions of logic elements and connection relationship of signals, for example, as shown in the foregoing Acuna et al IEEE literature. The input data for analog analysis is a description which indicates the characteristics of circuit elements and connection relationship thereof, for example, as shown in L. W. Nagal, "SPICE 2: A computer program to simulate semiconductor circuit", Electron. Res. Lab., Univ. of Calif., Berkeley, Rep. ERL-M500, May, 1975.

A circuit described at logic level, i.e., for digital analysis is subjected to logic simulation and therefore analyzed by the logic simulator 5. A circuit described at circuit level, i.e., for analog analysis is subjected to circuit simulation and analyzed by the circuit simulator 6.

The signal conversion unit 7 mutually converts a digital signal binary signal) processed by the logic simulator 5 and an analog signal (continuous signal) processed by the circuit simulator 6. The current calculation unit 8 for a digital analyzed circuit portion calculates, in synchronism with logic simulation, a consumed current such as an output transient current generated during logic simulation of a logic element which is subjected to the logic simulation. The logic element here refers to a circuit element which treats an input and an output as discrete values and is also called "a logic gate."

Figure 2:
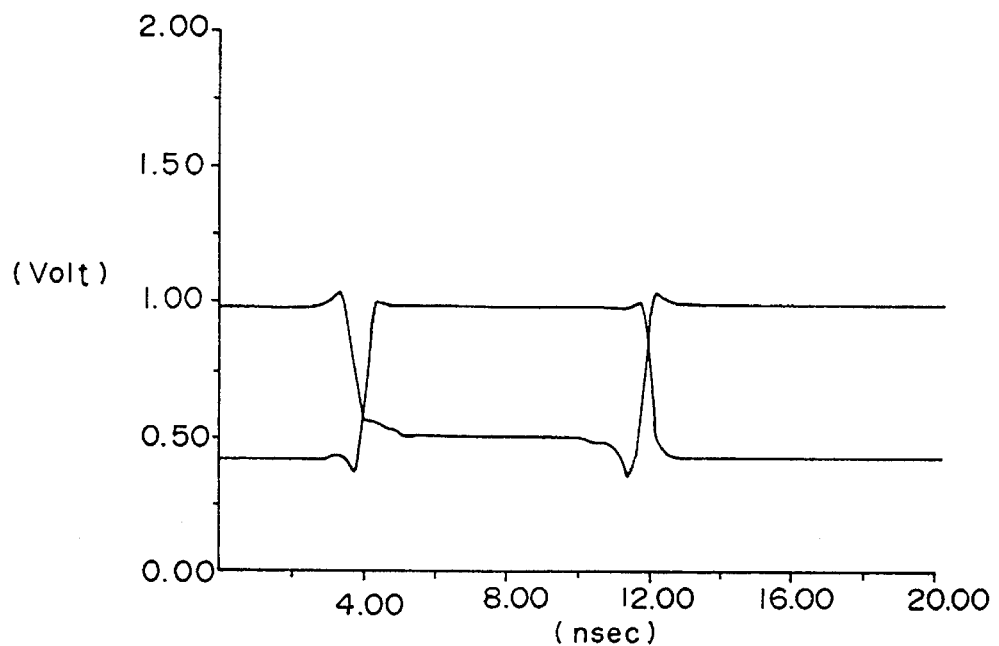
FIG. 2 is a graph for explaining an example of an output result of circuit simulation.
Figure 3:
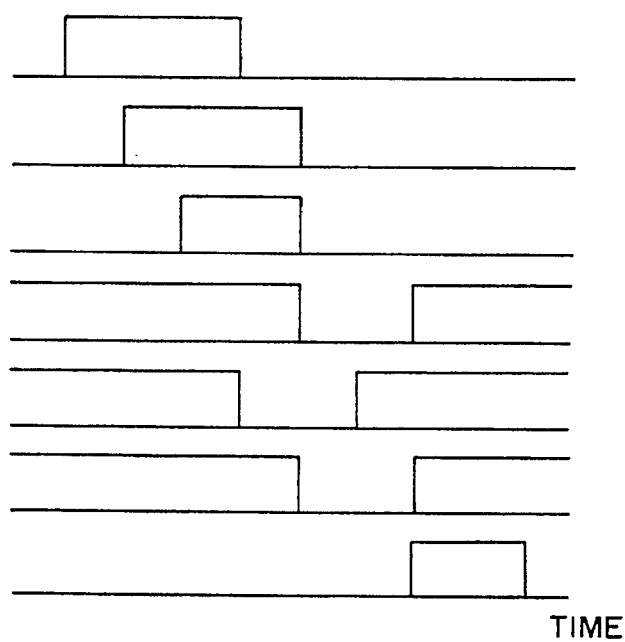
FIG. 3 is a timing chart for explaining an example of an output result of logic simulation.

The output from the mixed mode simulator 3 is data indicative of the result of analysis executed for a circuit to be analyzed, i.e., a file 9. The analysis execution result file 9 includes an analog output result of circuit simulation as illustrated in FIG. 2 and a binary pattern output result of logic simulation as illustrated in FIG. 3.

Figure 4:
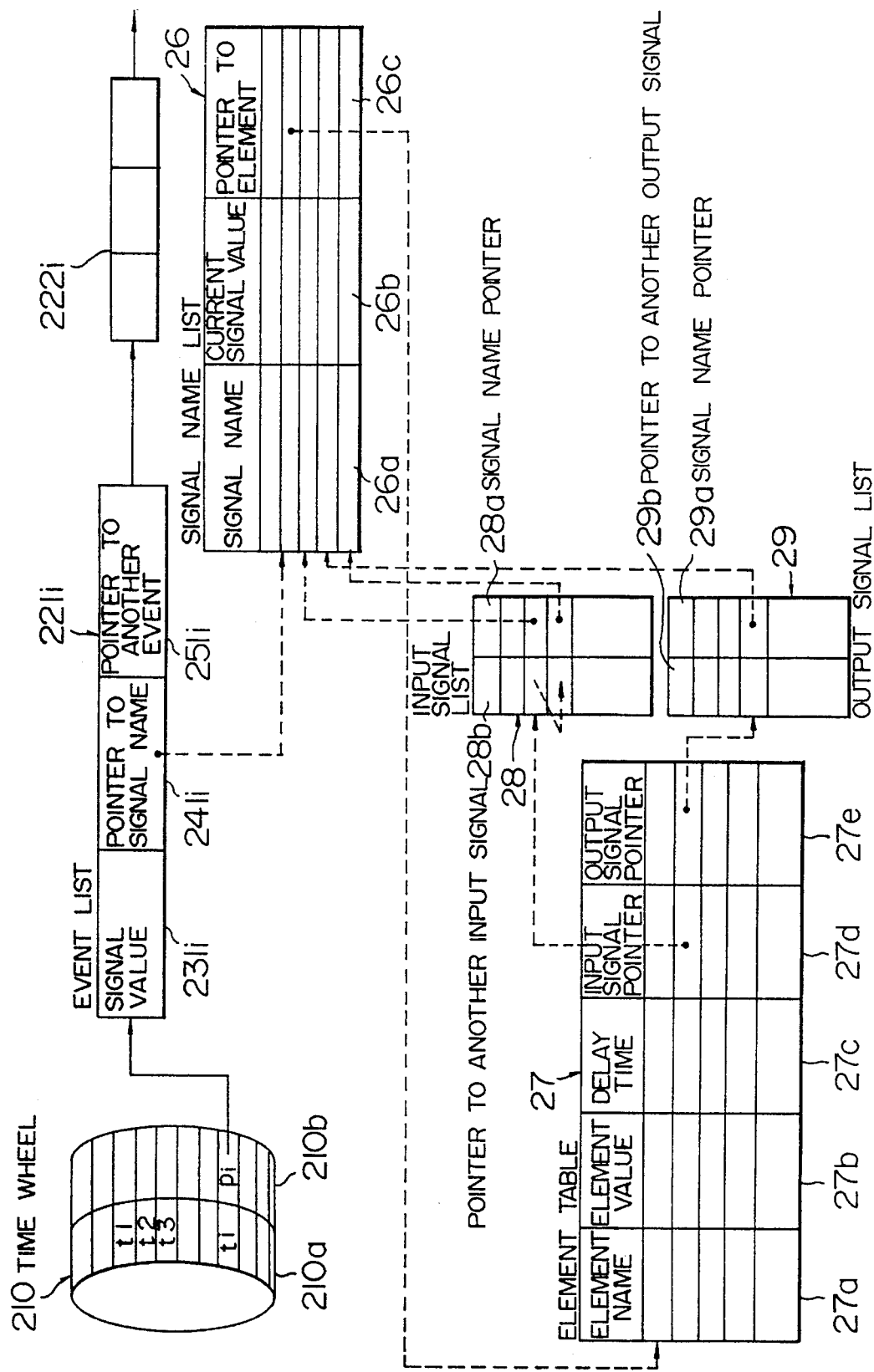
FIG. 4 is a diagram illustrating an example of data used when a logic simulation is executed, for explaining the structure of the data.

FIG. 4 illustrates an example of the data structure used for executing logic simulation.

The logic simulator 5 controls analysis using a time wheel 210. The time wheel 210 is a table on which a time 210a is placed corresponding to a pointer 210b. A pointer Pi corresponding to time ti indicates an event list 221i of a signal which changes at the time ti.

The event list 221i is a table which lists a signal value 231i of a signal changed by an event and a pointer 241i to a signal name and a pointer 251i to another event, in correspondence to each other. The pointer 251i to another event indicates an event list 222i of another signal which changes at the time ti. The pointer 241i to a signal name indicates an entry of a corresponding signal name in a signal name list 26. The signal name list 26 is a table which lists a signal name 26a, a signal value 26b which has been registered at a current time (referred to as "the current signal value"), and a pointer 26c to an element, in correspondence to each other. The pointer 26 to an element indicates an entry of a corresponding element in an element table 27.

The element table 27 is a table which lists an element name 27a; an element type 27b; a delay time 27c; an input signal pointer 27d; and an output signal pointer 27e in correspondence to each other. The input signal pointer 27d indicates an entry corresponding to a signal which is inputted to a designated element in an input signal list 28. The input signal list 28 comprises a signal name pointer 28a which indicates an entry corresponding to the inputted signal in the signal name list 26, and a pointer 28b to another input signal corresponding to another signal which is inputted to the designated element together with that signal.

The output signal pointer 27e indicates an entry corresponding to a signal which is outputted from a designated element in an output signal list 29. The output signal list 29 comprises a signal name pointer 29a which indicates an entry corresponding to the outputted signal in the signal name list 26, and a pointer 29b to another output signal which indicates an entry corresponding to another signal outputted from the designated element together with that signal.

Figure 5:
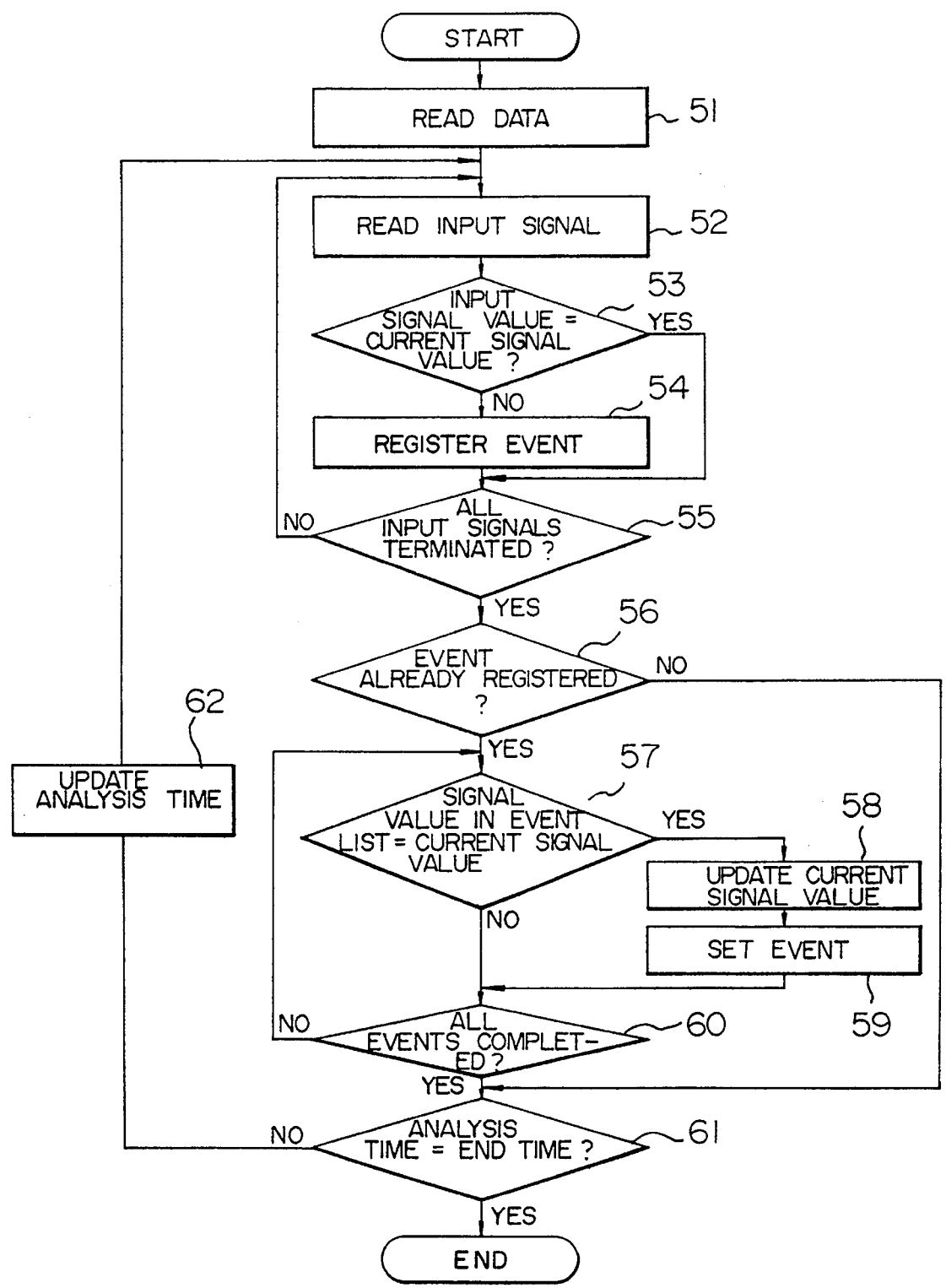
FIG. 5 is a flow chart illustrating a processing procedure of an example of logic simulation executed by a logic simulator.

FIG. 5 illustrates a processing procedure of an example of logic simulation executed by the logic simulator.

(1) At data read step 51 in FIG. 5, data at logic level is read which represents elements included in a digital analyzed circuit portion and their connection relationship.

(2) At input signal read step 52, an input signal value at a current analysis time is read.

(3) At comparison and determination step 53 for an input signal value and a current signal value, it is determined whether or not the input signal value read in the processing (2) is equal to a current signal value which has previously been registered.

(4) At event registration step 54, if the input signal value is determined to be different from the current signal value in the processing (3), the input signal value is registered as an event.

(5) At step 55 for determining completion of all signal input, it is determined whether the processings from (2) to (4) have been executed for all input signals.

(6) At step 56 for determining the presence or absence of a registered event, it is determined whether or not an event has been registered in the processing (4).

(7) At comparison and determination step 57 for a signal value in an event list and the current signal value, an event signal value registered at the current time is compared with the current signal value.

(8) At current signal value update step 58, the current signal value is updated by the event signal value if the event signal value is found to be different from the current signal value in the processing (7).

(9) At event set step 59, the event generated by the current signal value updated in (8) is set. A processing procedure for this event set will be later described in detail.

(10) At step 60 for determining completion of all events, it is determined whether or not the processings from (7) to (9) have been completed for all events.

(11) At step 61 for determining the completion of analysis, it is determined whether or not the analysis time has reached an end time.

(12) At step 62 for updating the analysis time, if the analysis time has not reached the end time in the processing (11), the analysis time is updated, and then the processing from (2) to (11) are repeated.

Figure 6:
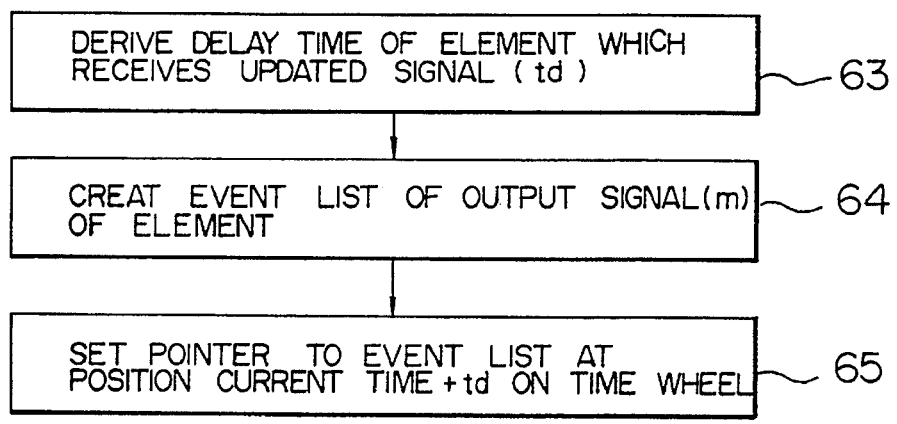
FIG. 6 is a flow chart illustrating an example of a processing procedure for an event set shown in FIG. 5.
Figure 7:
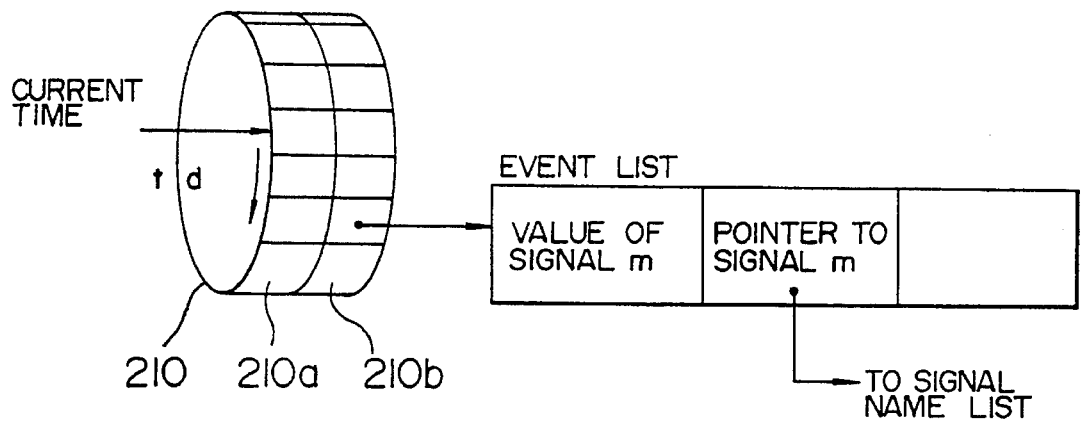
FIG. 7 is a diagram for explaining the structure of an example of data used when an event is set.

FIG. 6 illustrates details of the processing procedure for setting an event, and FIG. 7 an example of the data structure used when an event is set.

An event is set by a sequence of the following processings (1)–(3) as illustrated in FIG. 6:

(1) A delay time is derived for an element which is fed with a signal generated by updating a current signal value (step 63);

(2) An event list is created for an output signal of the element (step 64); and (3) A pointer indicating the event list is set to a position which is advanced by the delay time from the current time as shown in FIG. 7 (step 65).

Figure 9B:
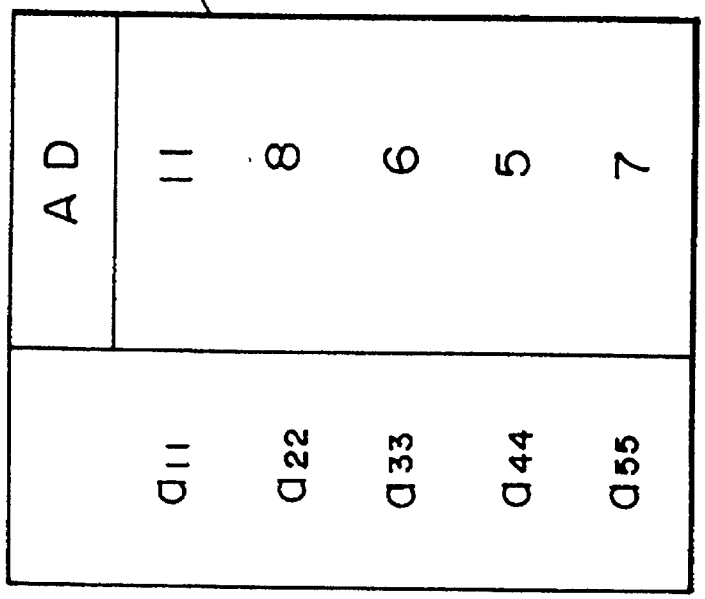
FIGS. 9A and 9B are a diagram for explaining diagonal elements and current vectors utilized in the equation of FIG. 8.
Figure 9A:
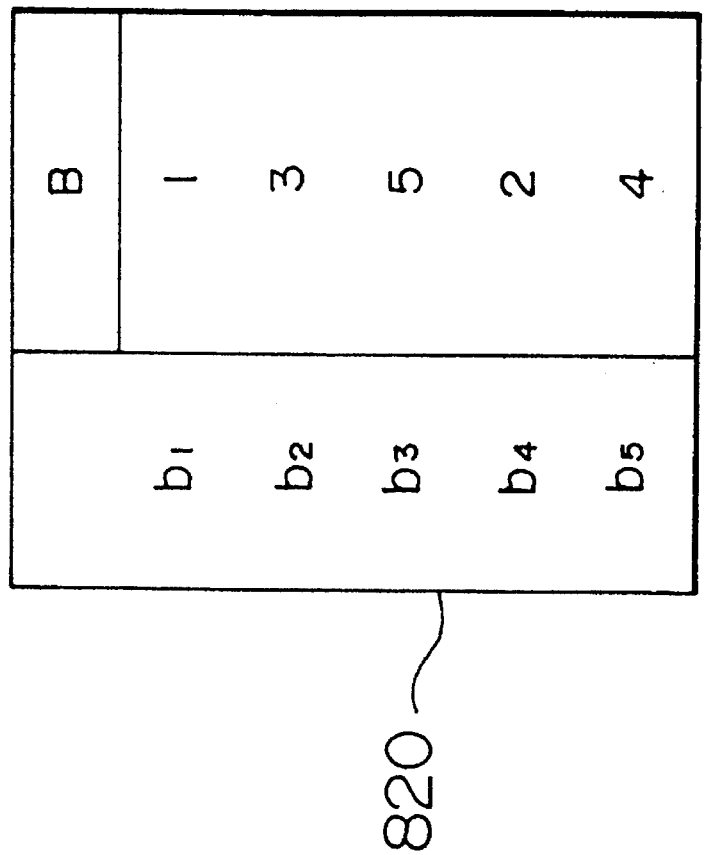
Figure 10:
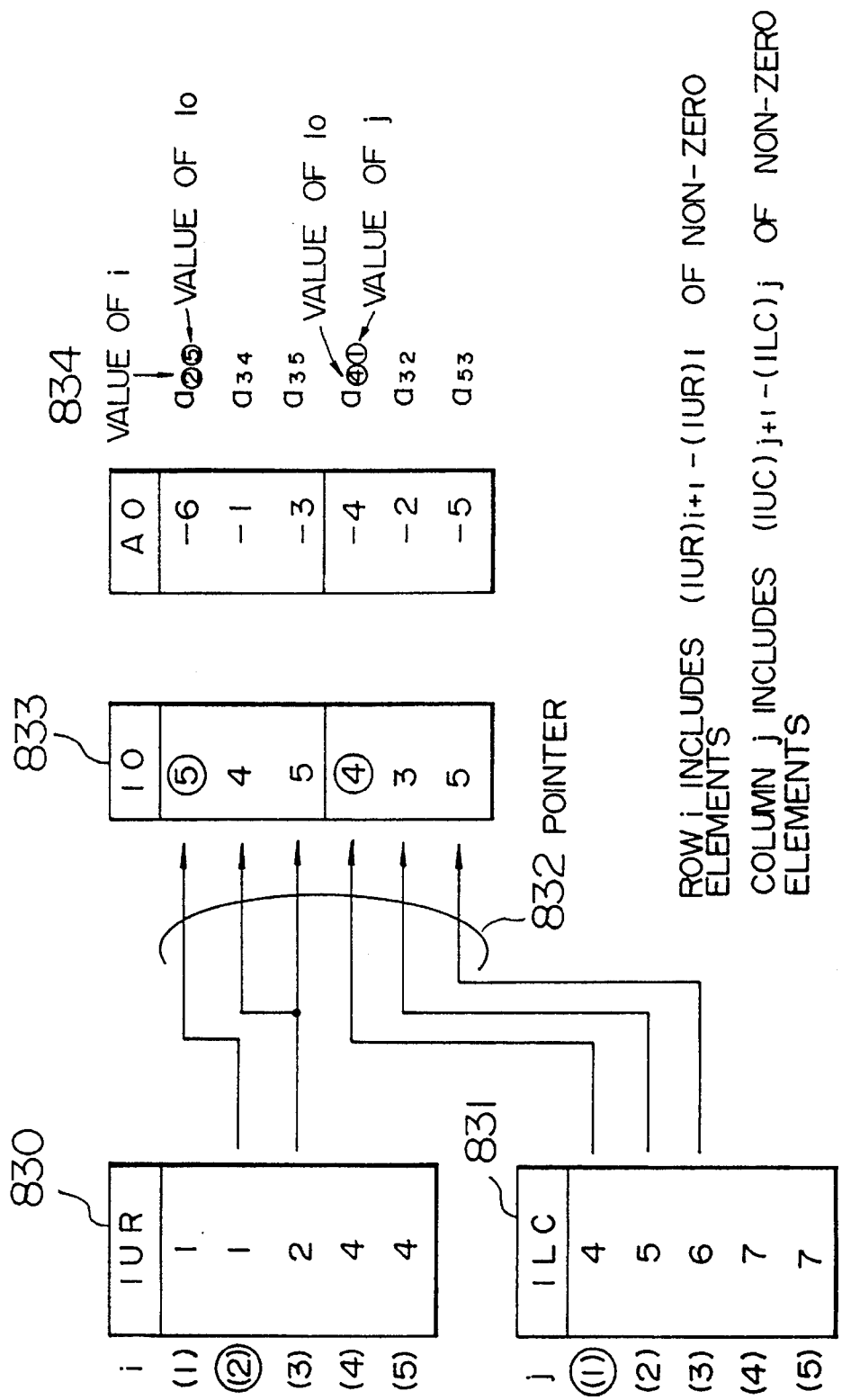
FIG. 10 is a diagram for explaining a matrix of a non-diagonal elements utilized in the equation of FIG. 8.

FIGS. 8–10 illustrate examples of data structures used when circuit simulation is executed.

The circuit simulator performs analysis using a circuit equation 801 which is expressed in an ordinary form in FIG. 8. The circuit equation 801 is formed of an admittance matrix 802; a node voltage vector 803; and a current vector 804. This equation matrix is a sparse matrix 805 which has a major part occupied by a zero element. Data of such an equation are comprised of a diagonal element (AD) 810; a current vector (B) 820; and an upper half matrix (IUR) 830 and a lower half matrix (ILR) 831 which are non-diagonal elements. The non-diagonal elements (IUR) 830 and (ILR) 831 are related with a table (IO) 833 which is indicated by a pointer 832. Specifically, contents j of the table (IO) 833 indicated by the $i^{th}$ value of the non-diagonal element (IUR) 830 shows the value of $a_{ij}$ in the admittance matrix. The element $a_{ij}$ is designated by 834 in the drawing.

Figure 11:
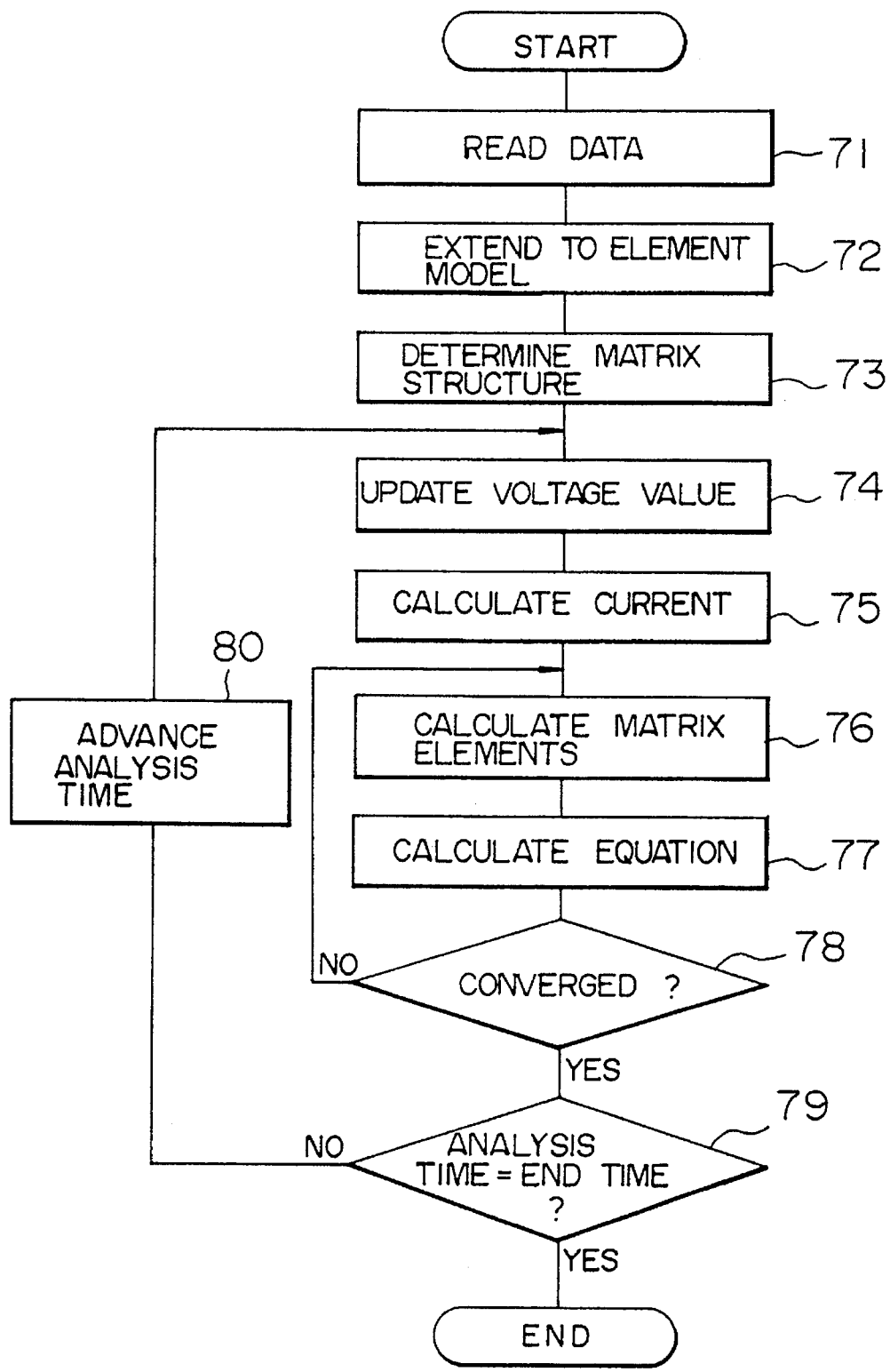
FIG. 11 is a flow chart illustrating a processing procedure of an example of circuit simulation executed by a circuit simulator.

FIG. 11 illustrates a processing procedure of an example of circuit simulation executed by the circuit simulator 6.

(1) At data read step 71 shown in FIG. 11, input data for analog analysis is read which indicates elements in an analog analyzed circuit portion and their connection relationship.

(2) At step 72 for extending to an element model, each element is replaced by an element model represented by a resistor and a current source.

(3) At matrix structure determination step 73, a circuit matrix is produced for solving a circuit equation.

(4) At voltage value update step 74, a voltage value is set to a node whose voltage value is determined by an input signal.

(5) At current calculation step 75, a current value is set to each current source.

(6) At step 76 for calculating matrix elements, values are set to elements in a circuit matrix by substituting a parameter value of each element for each matrix element.

(7) At equation calculation step 77, the circuit equation is solved using an iteration method.

(8) At convergence determination step 78, it is determined whether the calculation in the processing (7) is converged.

(9) At step 79 for determining the completion of analysis, it is determined whether an analysis time has reached an analysis end time.

(10) At step 80 for advancing the analysis time, the analysis time is advanced if the analysis has not been completed in the processing (9), and then the processings from (4) to (9) are repeated.

Figure 12:
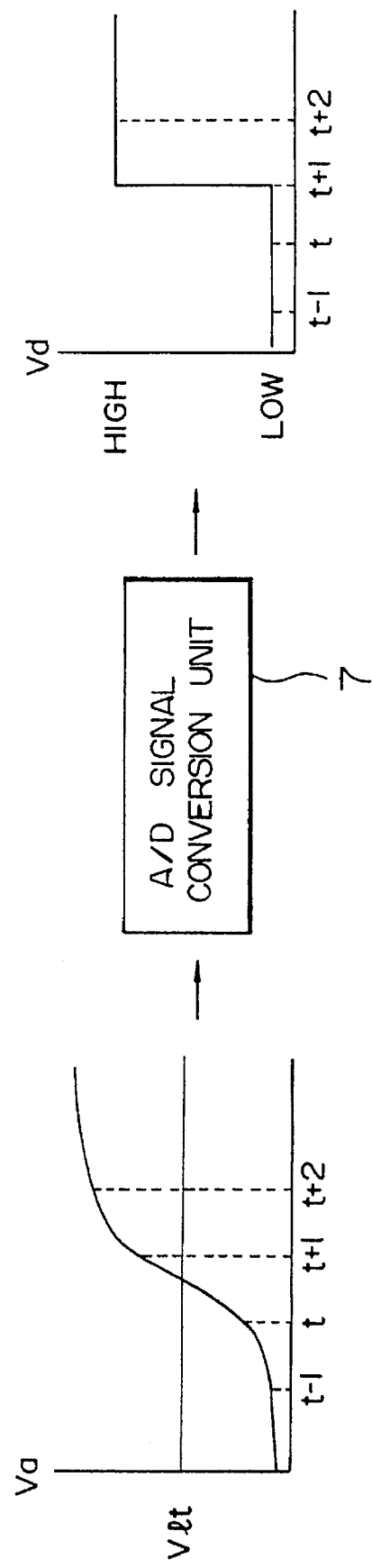
FIG. 12 are waveform charts of an analog signal and a digital signal converted therefrom by an A/D & D/A signal conversion unit.

FIG. 12 illustrates exemplary waveforms of an analog signal and a digital signal converted from the analog signal by the foregoing signal conversion unit 7. Referring to FIG. 12, the ordinate Va represents an analog voltage on which Vlt indicates a logic threshold voltage for converting an analog signal to a digital signal. The ordinate Vd represents a digital signal voltage on which HIGH indicates a high level voltage which corresponds to, for example, a voltage of logical "1", and LOW indicates a low level voltage which corresponds to, for example, a voltage of logical "0".

Figure 13:
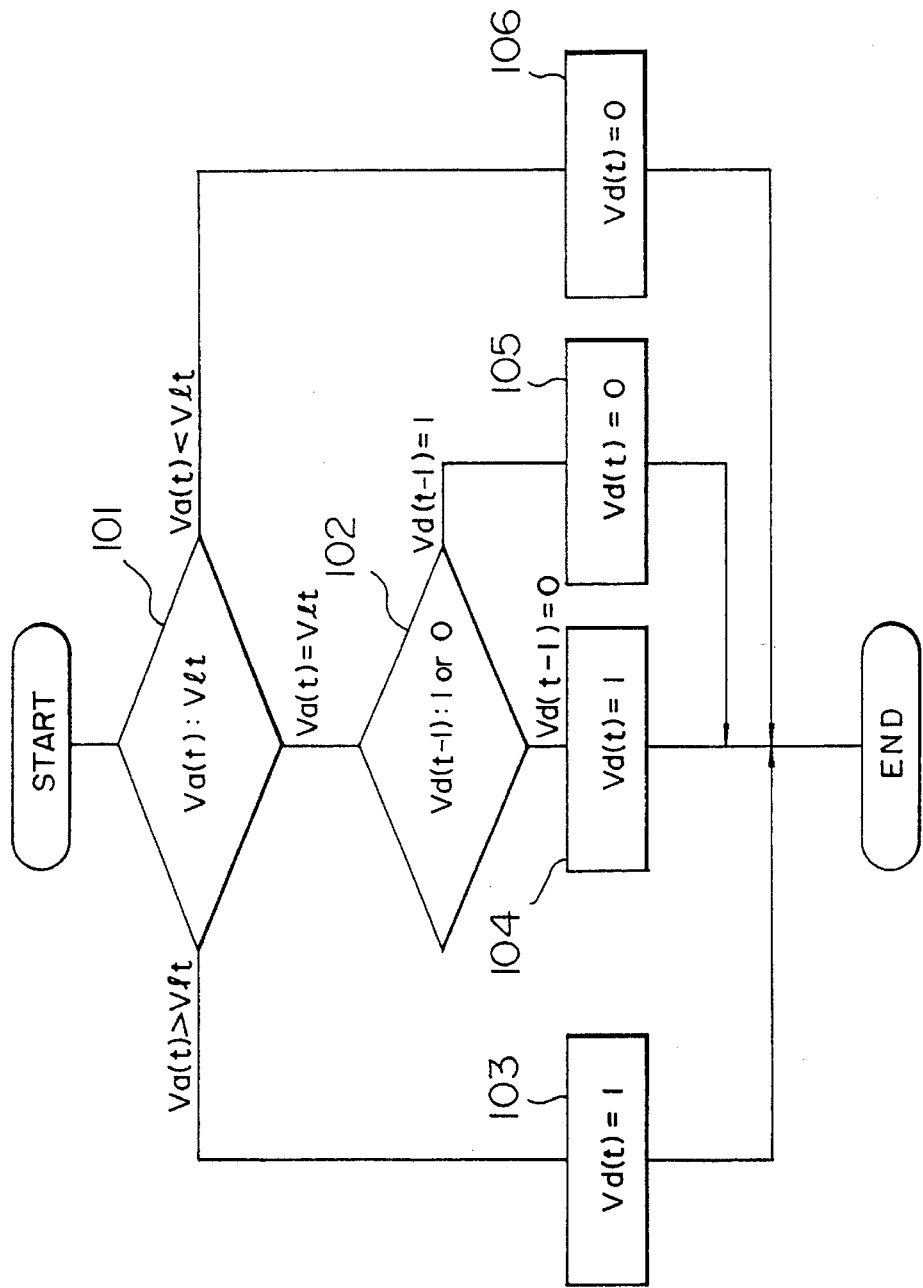
FIG. 13 is a flow chart illustrating an example of a processing procedure for converting an analog signal to a digital signal to derive the converted waveform shown in FIG. 12.

FIG. 13 illustrates an example of a processing procedure for converting an analog signal to a digital signal to generate the converted waveform shown in FIG. 12.

(1) An analog signal Va(t) as an output voltage value of an analog analyzed circuit portion at time t in FIG. 13 is compared with the logic threshold voltage Vlt to determine which is higher (step 101).

(2) If the analog signal Va(t) is lower than the logic threshold value Vlt, a digital signal Vd(t) as an input signal value to a digital analyzed circuit portion at the time t is set to logical "0" (Vd(t)=0) as shown at step 106.

(3) If the analog signal Va(t) is higher than the logic threshold voltage Vlt, the digital signal Vd(t) is set to logical "1" (Vd(t)=1).

(4) If the analog signal Va(t) is equal to the logic threshold voltage Vlt, a logic level of a signal value Vd(t−1) at the previous logic simulation time (t−1) of the digital signal Vd is determined (step 102), and a logic value different from the determination result is set to the digital signal Vd(t) (steps 104, 105).

Figure 14:
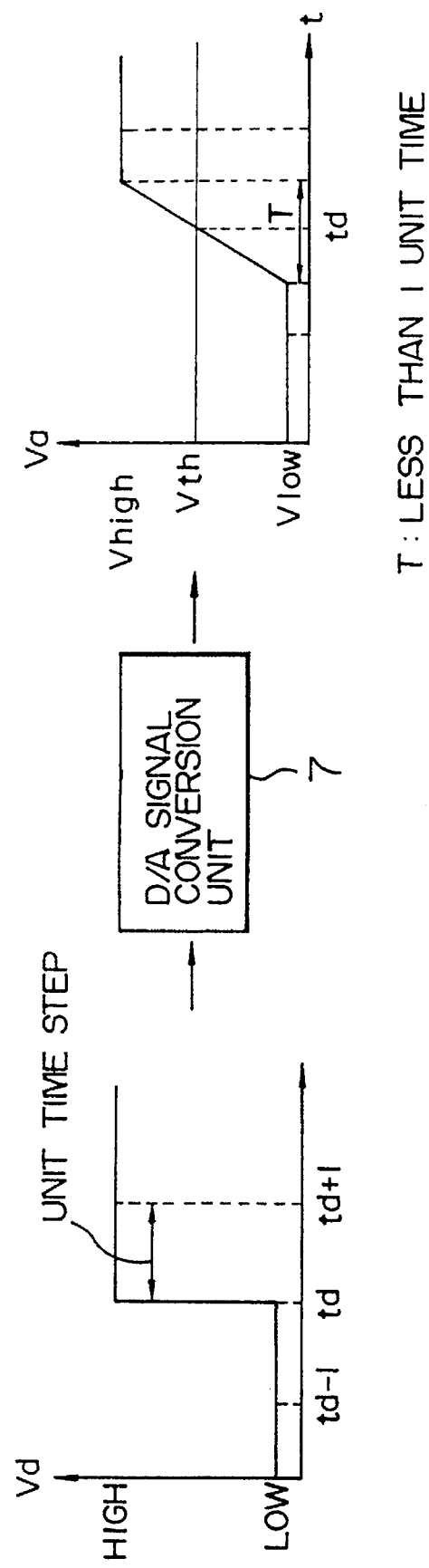
FIG. 14 are waveform charts of a digital signal and an analog signal converted therefrom by the foregoing A/D & D/A conversion unit.

FIG. 14 illustrates exemplary waveforms of a digital signal and an analog signal converted from the digital signal by the signal conversion unit 7. Referring to FIG. 14, the ordinate Vd represents a digital signal voltage where HIGH indicates a high level voltage which corresponds to, for example, a voltage of logical "1", while LOW indicates a low level voltage which corresponds to, for example, a voltage of logical "0". The ordinate Va represents an analog signal on which Vhigh (also referred to simply as Vh) indicates analog voltage corresponding to Vd=1 (logical "1"); Vlow an analog signal corresponding to Vd=0 (logical "0"); and Vth a threshold value voltage.

Figure 15:
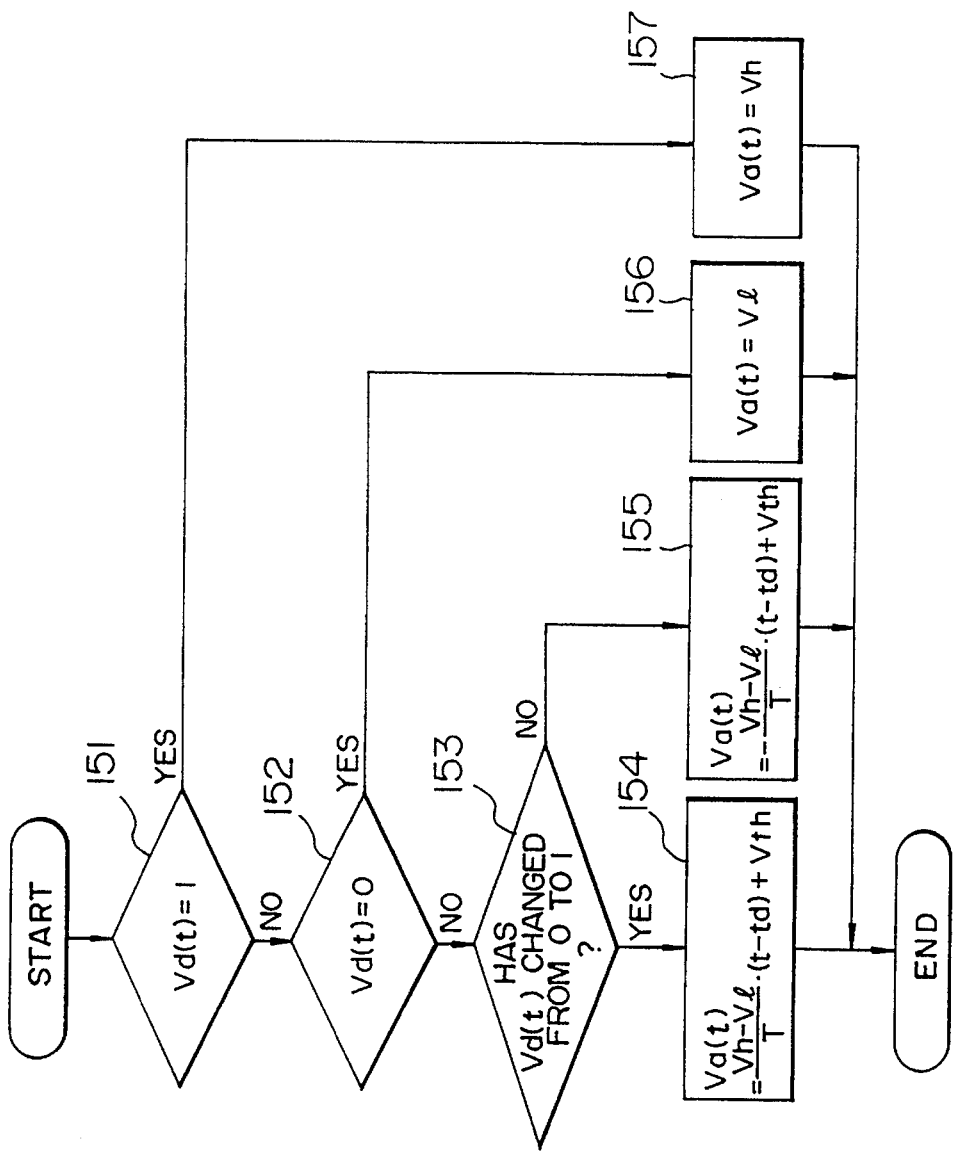
FIG. 15 is a flow chart illustrating an example of a processing procedure for converting a digital signal to an analog signal to derive the converted signal of FIG. 13.

FIG. 15 illustrates an example of a processing procedure for converting a digital signal to an analog signal to produce the converted waveform shown in FIG. 13.

(1) Referring to FIG. 15, it is determined whether or not a logic level of a digital signal Vd(t) as an output voltage value of a digital analyzed circuit portion at time t is "1" (step 151). If the logic level is "1", the digital signal Vd(t) is converted to an analog signal value Vh which corresponds to Vd(t)=1 (step 157). If the determination result at step 151 shows that the logic value is not "1", it is determined whether or not the logic level of the digital signal Vd(t) is "0" (step 152). If the logic level is "0", the digital signal Vd(t) is converted to an analog signal value Vl which corresponds to Vd(t)=0 (step 156).

(2) If the digital signal Vd is not logical "1" or "0", that is, if the digital signal Vd is in a transient stage where its logic value is changing, the changing direction is determined (step 153). Then, the digital signal is converted to an analog signal Va(t) which changes during a predetermined time interval T between a rising edge and a falling edge in accordance with the determined direction (steps 154, 155).

It should be noted that the techniques described in connection with FIGS. 4–15 may be implemented by generally known procedures.

Figure 16A:
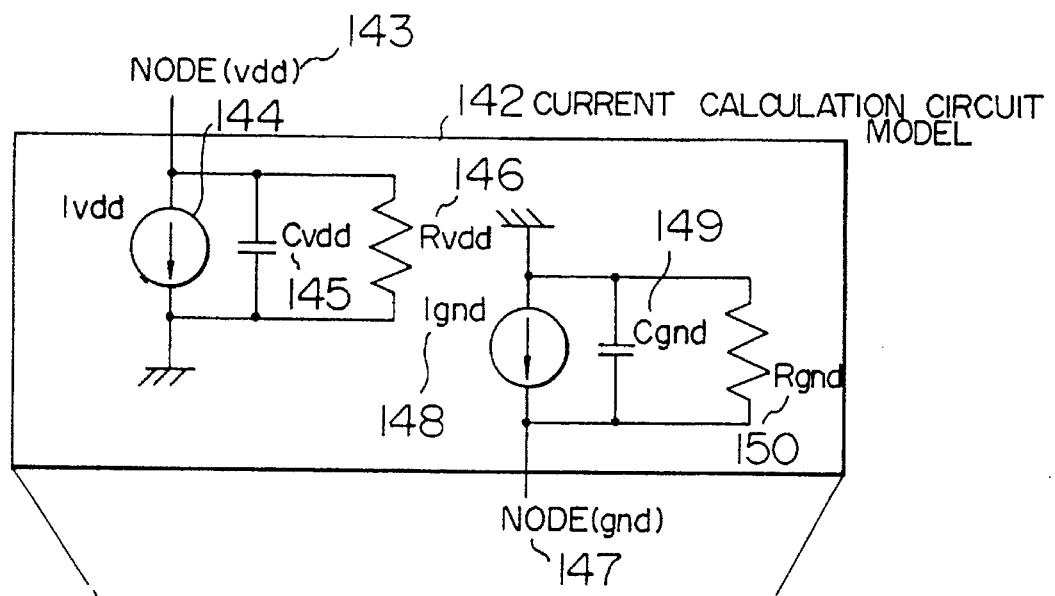
FIGS. 16A and 16B are a diagram for explaining an example of a current model for a current calculation performed by a current calculation unit in a digital analyzed circuit portion.
Figure 16B:
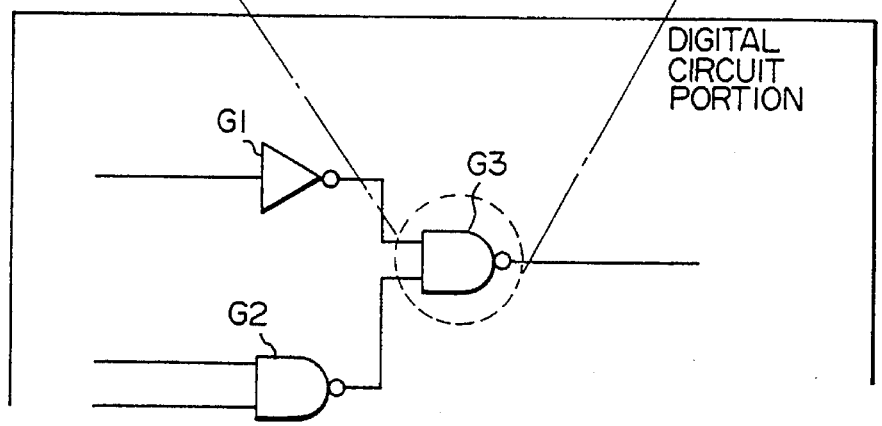

FIGS. 16A and 16B illustrate an example of a current calculation circuit model for the digital analyzed circuit current calculation unit 8 to executes a current calculation. A circuit model 142 for current calculation shown in FIGS. 16A and 16B is made to match with a logic element in a digital analyzed circuit portion, for example, a two-input NAND gate G3.

The current calculation circuit model 142 for the two-input NAND gate G3 comprises a power supply current noise current source (Ivdd) 144 for representing a current flowing through a node on the power supply side (NODEvdd) 143; an equivalent circuit represented by a capacitor (Cvdd) 145 and a resistor (Rvdd) 146 which is connected in parallel to the current source (Ivdd) 144; a ground noise current source (Ignd) 148 for representing a current flowing through a ground node (NODEgnd) 147 of the two-input NAND gate G3; and an equivalent circuit represented by a capacitor (Cgnd) 149 and a resistor (Rgnd) 150 connected in parallel to the current source (Ignd) 148.

Figure 17:
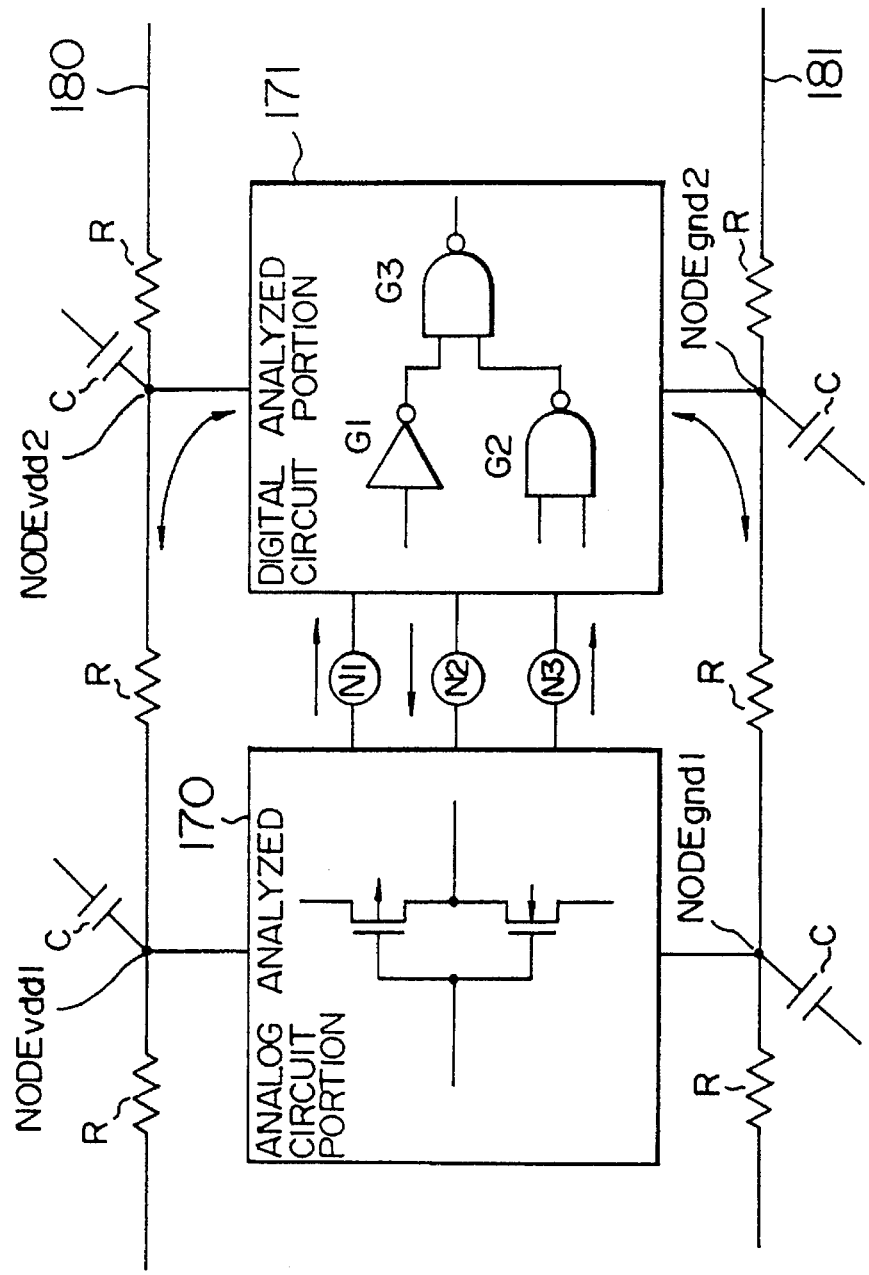
FIG. 17 is a diagram for explaining an example of a conceptual structure of a circuit subjected to simulation.

FIG. 17 illustrates an example of a conceptual arrangement of a circuit which is subjected to mixed mode simulation. Referring to FIG. 17, an analog analyzed circuit portion 170 and a digital analyzed circuit portion 171 are connected to a power supply line 180 through power supply nodes NODEvdd1 and NODEvdd2, respectively, as well as to a ground line 181 through ground nodes NODEgnd1 and NODEgnd2, respectively. The power supply line 180 and the ground line 181 are each shown as including equivalent resistance component R and a capacitance component C. The digital analyzed circuit portion 171 is driven, for example, on the basis of output signals N1, N3 of the analog analyzed circuit portion 170. Thus, the power supply line 180, ground line 181, resistance components R and capacitance components C form a power supply net in view of a power supply system.

Figure 18:
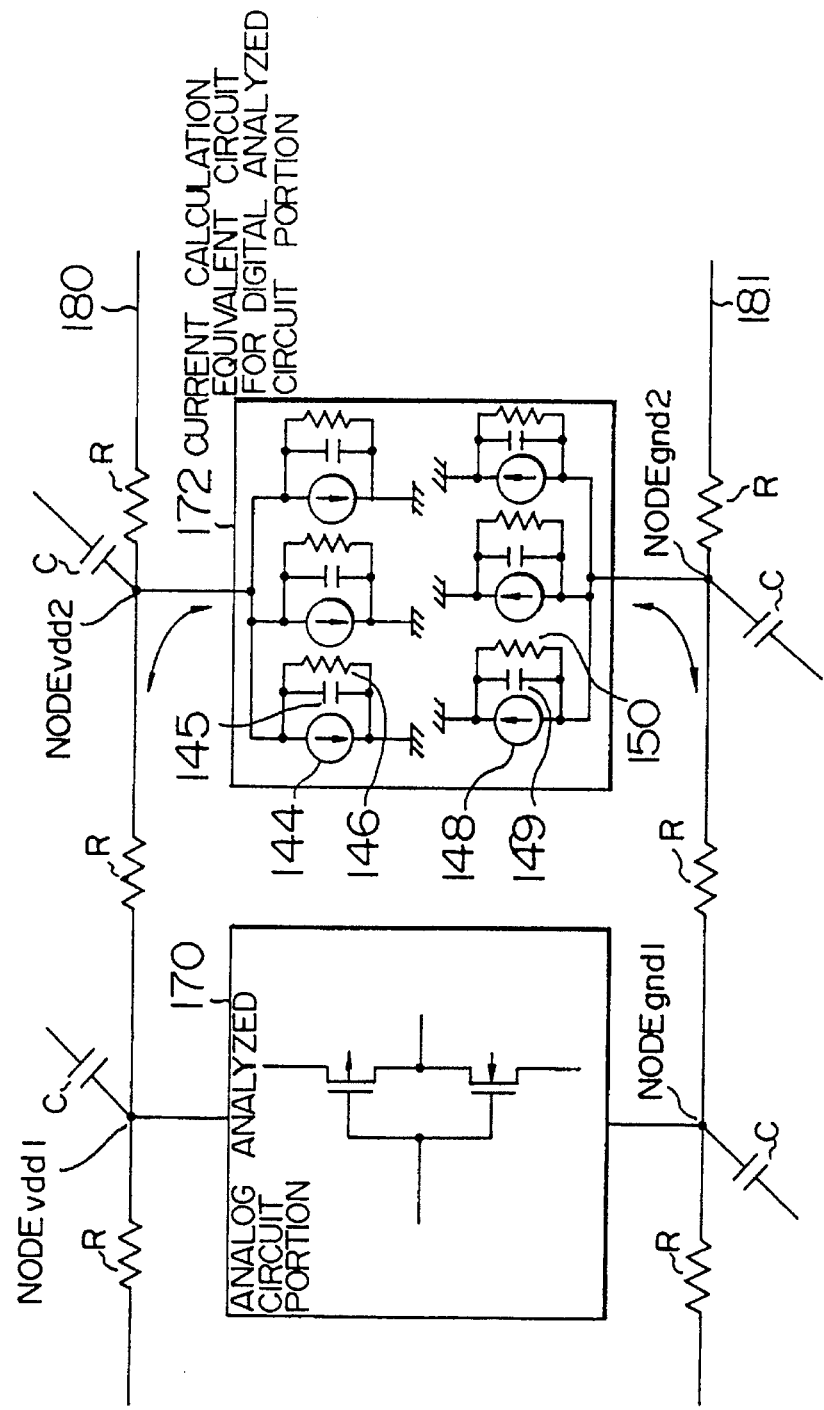
FIG. 18 is a circuit diagram illustrating a composite circuit composed of a current calculation circuit, where the circuit model for calculating a current is applied to logic elements in the digital analyzed circuit, and an analog analyzed circuit.

FIG. 18 illustrates a composite circuit composed of a current calculation equivalent circuit 172 in which the foregoing circuit model for current calculation is applied to logic elements constituting the digital analyzed circuit portion 171 of FIG. 17 and the analog analyzed circuit portion 170. By executing circuit simulation for such a composite circuit, the influence of current noise on the power supply line 180 and the ground line 181 caused by the operation of the digital analyzed circuit portion 170 driven by the output signals N1, N3 from the analog analyzed circuit portion 170 can be fed back to the operating characteristic of the analog analyzed circuit portion 170 through the power supply line 180 and the ground line 181, thereby making it possible to evaluate the highly accurate total characteristics of the analog analyzed circuit portion 170 and the digital analyzed circuit portion 171.

FIGS. 19A–19D illustrate examples of a logic model and a current model for an NAND gate chosen as an example of a logic gate.

As illustrated in FIG. 19A, a two-input NAND gate having two inputs IN1, IN2 and an output OUT is taken as an example. This NAND gate, if formed of a CMOS circuit, is represented as shown in FIG. 19B, where CL designates a load capacitor on the output side. This logic model for the two-input NAND gate operates in accordance with a truth table whose contents are shown in FIG. 19C. FIG. 19D shows conceptual contents of a current model in the two-input NAND gate. Specifically, combinations of input logic values are used as a state variable, and a transient state of a current through the load capacitor CL is shown in terms of a change of the state variable. More specifically, when a combined state of the two inputs IN1, IN2 (00, 01, 10, 11) are given as a state variable, a transient state is indicated as discharge (expressed by GND) or recharge (expressed by VDD) of the load capacitor or no change (expressed by "–") when the state variable changes from a state indicated in the vertical direction (on a column A) to a state indicated in the horizontal direction (on a row B). It can be seen, for example, that the load capacitor CL is discharged when the states of the two inputs IN1, IN2 change from 00 (A side) to 11 (B side); 01 (A side) to 11 (B side); or 10 (A side) to 11 (B side). Conversely, the load capacitor is recharged when the states of the two inputs IN1, IN2 change from 11 (A side) to 00 (B side); 11 (A side) to 01 (B side); or 11 (A side) to 10 (B side). Other changes of the state variable do not cause a change in the output. With this current model, a timing of discharging or recharging the output load capacitor CL can be known from the transient state of the inputs. Incidentally, the description formats for the logic model and the current model are not limited to those shown in FIGS. 19C and 19D. It is also possible to use the output logic value as the state variable. Further, when logic values of the two inputs are used as a state variable in FIG. 19D, the state variable may be related to output logic values.

FIG. 20 illustrates examples of various events of a logic element and current waveforms generated from the logic element as a result of the respective events.

A description of an input signal pattern fed to a logic element may be given as a change in the input logic value at time t, for example, as shown in the inputs IN1, IN2 of FIG. 20. When logic simulation is executed for a logic element such as a two-input NAND gate by the logic model, current model and input pattern, the output OUT in accordance with the logic model shown in FIGS. 19A–19D and a timing of generating a recharging current (VDD side) or a discharging current (GND side) in accordance with the current model shown in FIGS. 19A–19D are derived.

Figure 21:
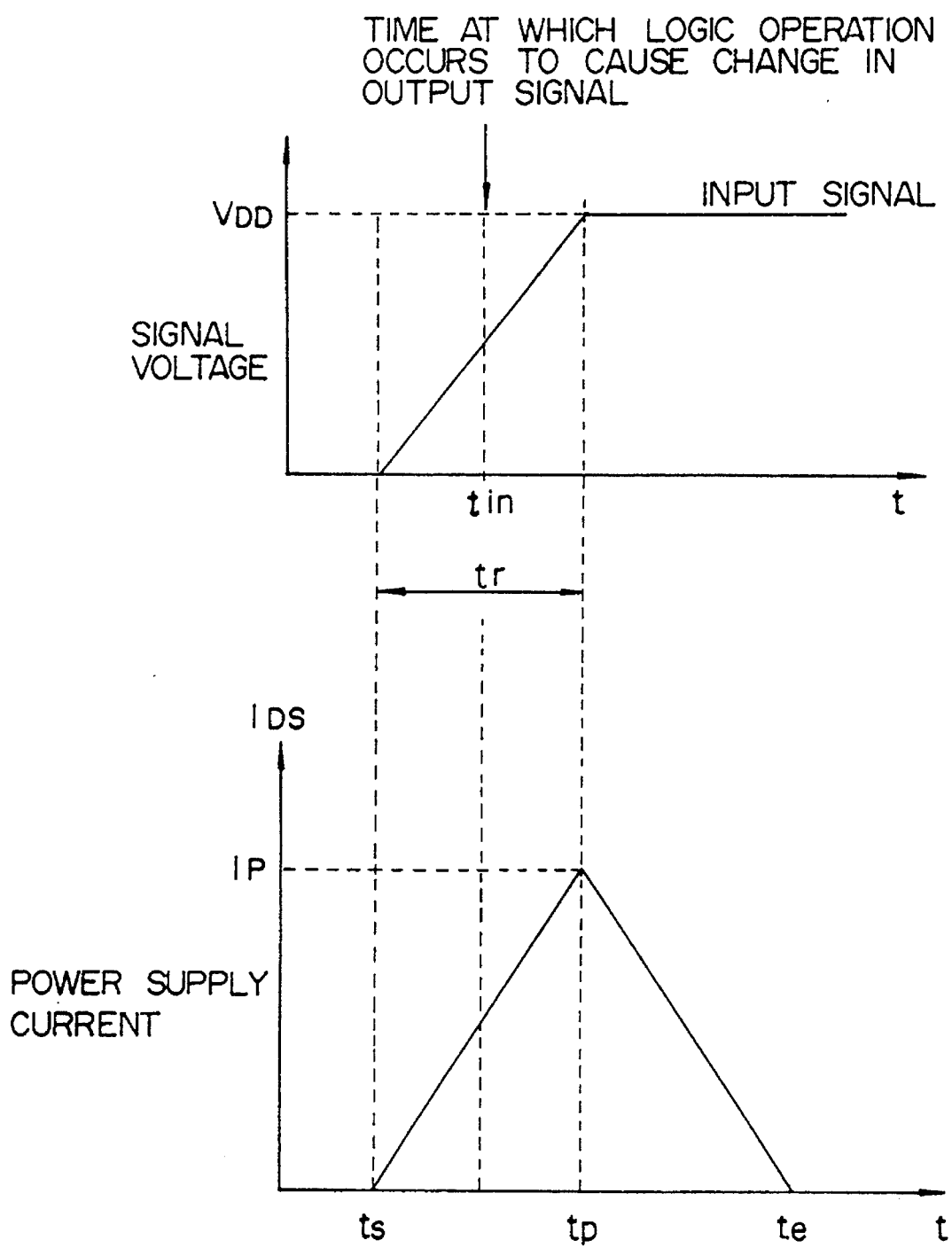
FIG. 21 are graphs for explaining an example of a method for calculating a source current which should be generated by a logic operation of a logic element comprised of CMOS circuits.

FIG. 21 illustrates an example of a calculation method for calculating a source current to be generated by a logic operation of a logic element formed of a CMOS circuit. The method illustrated in FIG. 21 is a method for approximating a current waveform to a triangle. According to this example, a timing at which an output level of a logic element changes during the execution of logic simulation, i.e., a logic operation occurring time comes at time tin at which an input signal to the logic element is half as much as a logic amplitude (i.e., VDD/2). The actual input signal to the logic element transiently changes within a time interval tr. In consideration of the above, a start time ts of the input signal is calculated by:

$$ts=tin-tr/2; \text{ and}$$

time tp at which the current presents a peak value Ip is calculated by:

$$tp=tin+tr/2.$$

At this time, the peak current value Ip of a recharging or discharging current is calculated in accordance with the equation of a saturated current of MOSFET by:

$$Ip=\tfrac{1}{2}\cdot\beta 0\cdot(W/L)\cdot(VDD-Vth)^2.$$

Also, time te at which recharge or discharge is completed is calculated by:

$$te=(2/Ip)\cdot CL\cdot(VDD-Vth)+ts$$

From the above equations, a total charge amount required for recharging or discharging the load capacitor CL is derived from the dimension of the current waveform. More specifically, the discharging current is derived from the dimension of a triangle defined by three points Ip, tp, te in FIG. 21, while the recharging current is derived from the dimension of a triangle defined by three points Ip, tp, ts in FIG. 21.

Figure 22A:
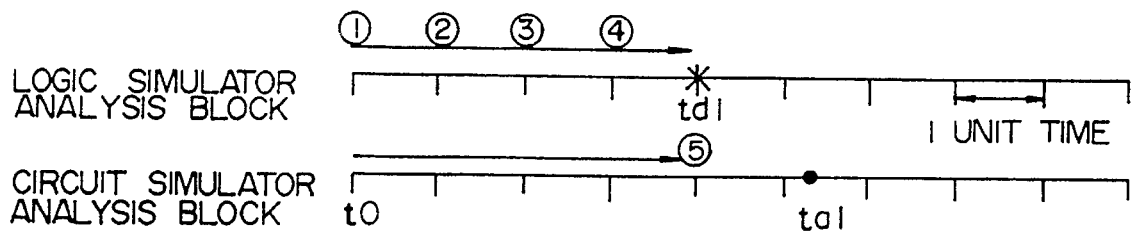
FIGS. 22A–22C are time charts illustrating a principle processing procedure of a synchronization control performed by a synchronization control unit for synchronizing a logic simulator with a circuit simulator to execute mixed mode simulation.
Figure 22B:
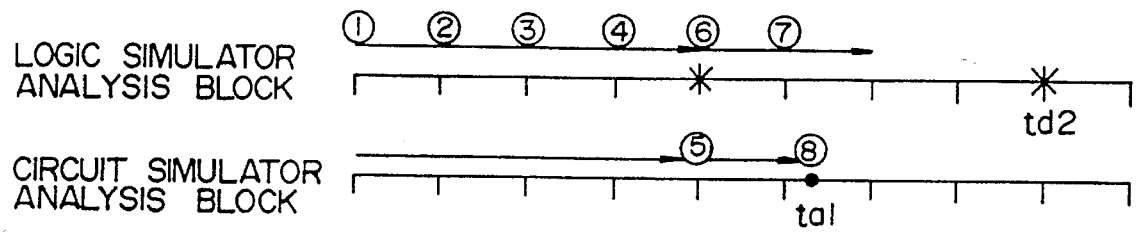
Figure 22C:
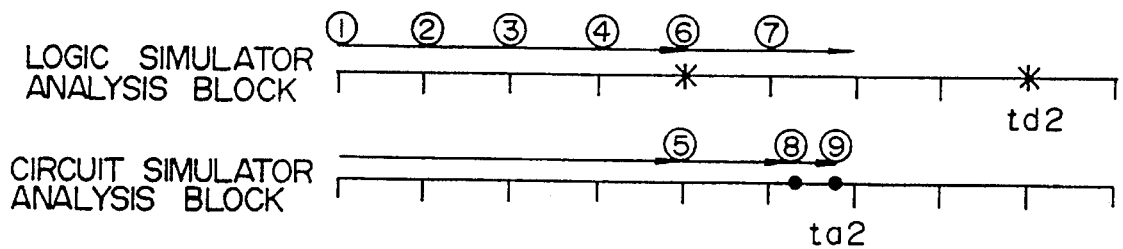
Figure 23A:
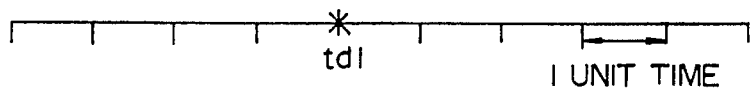
FIGS. 23A–23C are time charts illustrating an example of a processing procedure for resetting an analysis switching time in the synchronization control.
Figure 23B:
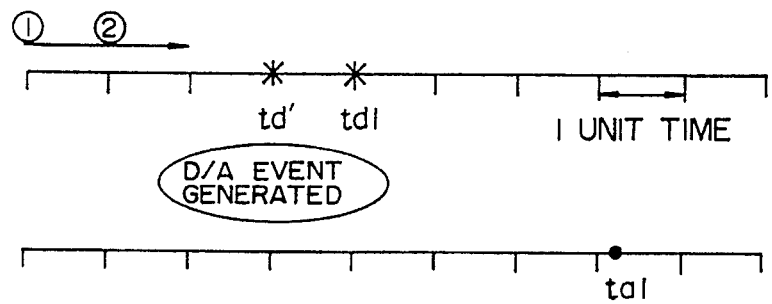
Figure 23C:
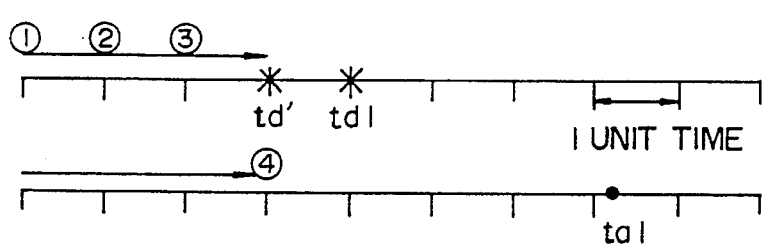
Figure 24A:
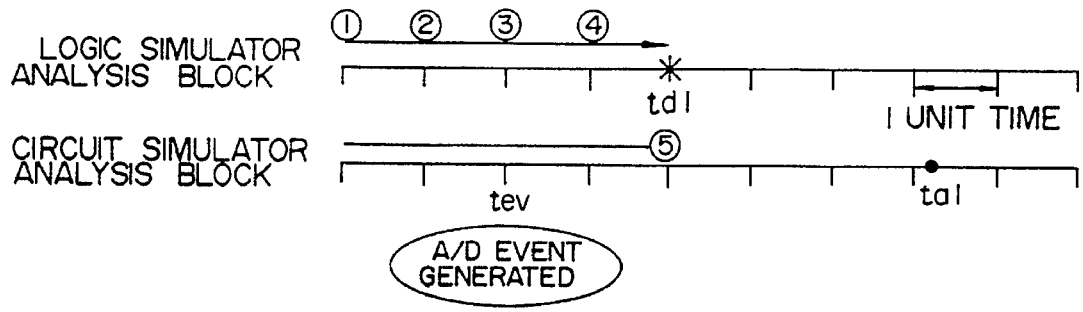
FIGS. 24A–24B are time charts illustrating an example of a registration processing for an analog/digital (A/D) event in the synchronization control.
Figure 24B:
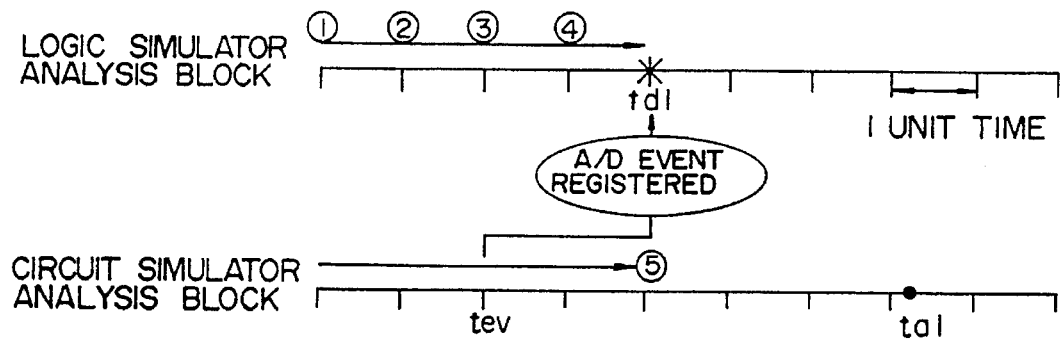

FIGS. 22A–22C illustrate an example of a processing procedure of the principle of a synchronization control for executing mixed mode simulation by establishing synchronization between the logic simulator 5 and the circuit simulator 6 using the simulator synchronization controller 4. FIGS. 23A–23C illustrate an example of a processing procedure for resetting an analysis switching time in the synchronization control. FIGS. 24A–24B illustrate an example of a registration processing for an analog-to-digital (A/D) event in the synchronization control. A basic processing procedure of the synchronization control in mixed mode simulation will be described with reference to these drawings.

The synchronization control in mixed mode simulation calculates a time at which synchronization should be established between the logic simulator 5 and the circuit simulator 6, in other words, an analysis switching time from a time at which a signal or event to be transferred from the logic simulator 5 for performing digital analysis to the circuit simulator 6 for performing analog analysis, hereinafter simply referred to as "the digital-to-analog (D/A) event", is generated and a time at which the circuit simulator 6 is to perform analysis. This analysis switching time is selected to be the earlier one of a time at which a D/A event is registered and a time at which next analysis is to be performed. Then, simulation is advanced so as to execute logic simulation earlier than circuit simulation in principle, such that the logic simulation is executed by the analysis switching time, and subsequently the circuit simulation is executed. This processing will be described in greater detail with reference to FIGS. 22A–22C.

(1) In FIG. 22A which indicates D/A event registration time≦next analysis scheduled time for the circuit simulator, analysis is assumed to start from time t0. The earliest D/A event registration time appearing after that is designated by td1, while a next analysis scheduled time for the circuit simulator is designated by ta1. The time td1 earlier than ta1 is selected to be the analysis switching time. The logic simulator performs analysis until a unit time (①–④ in FIG. 22A) immediately before the analysis switching time. Then, the circuit simulator receives the analysis result of the logic simulator and begins its analysis at time td1 (⑤ in FIG. 22A).

(2) In FIG. 22B which indicates D/A event registration time>next analysis scheduled time for the circuit simulator, a next D/A event registration time is designated by td2, and a next analysis schedule time for the circuit simulator by ta1. Since the time ta1 appears earlier than the time td2, the time ta1 is selected to be an analysis switching time. Thus, the logic simulator performs analysis until a unit time (⑥–⑦ in FIG. 22B) immediately before the analysis switching time. Subsequently, the circuit simulator begins analysis at time ta1 (⑧ in FIG. 22B).

(3) In FIG. 22C which indicates next analysis scheduled time for the circuit simulator<next unit time, a next analysis scheduled time for the circuit simulator ta2 is assumed to appear earlier than a next unit time. In this case, the logic simulator does not advance analysis, and the circuit simulator performs analysis at time ta2 (⑨ in FIG. 22C).

In the above described synchronization control in principle, it is foreseen that a new D/A event is generated at a time earlier than the analysis switching time. A processing procedure for this case is shown in FIGS. 23A–23C. Assume that when the logic simulator is going to advance analysis until the analysis switching time td1 in FIG. 23A, a new D/A event is generated at a time td' in the middle of the analysis as shown in FIG. 23B. In such a case, the analysis switching time is reset to the time td' such that the logic simulator continues its analysis until the unit time immediately before the time td', and then the circuit simulator starts analysis at the time td'.

The circuit simulator 6 also performs transient analysis for a time period not exceeding the analysis switching time. When a signal to be transferred from the analog analyzed circuit portion to the digital analyzed circuit portion, i.e., an event from the circuit simulator 6 to the logic simulator 5 (hereinafter simply referred to also as "the A/D event") is generated in the middle of transient analysis, the A/D event is transferred to the logic simulator 5 at the time the logic simulator starts the next analysis. For example, in FIGS. 24A–24B illustrating this operation, assume that the logic simulator 5 performs analysis until the analysis switching time td1, analog analysis is performed at the time td1, and it is found as a result that an A/D event to be transferred to the logic simulator 5 has been generated at time tev. The A/D event is comparable to a state in which a signal to be transferred from an analog circuit portion to a digital circuit portion changes beyond a threshold value. In such a case, a signal indicative of an A/D event is transferred to the logic simulator at time td1 at which the logical simulator resumes next analysis, as shown in FIG. 24B. In this event, between time tev at which the A/D event was generated and time td1 at which the event is transferred to the logic simulator, an offset of time td1−tev is produced. However, from the viewpoint of the nature of the logic simulation which presents a high processing speed as compared with that of the circuit simulation, an error caused by such an offset is negligibly small in comparison with the circuit simulation. Therefore, such a procedure does not require to change the analysis switching time every time an A/D event is generated so that the processing efficiency of mixed mode simulation can be improved.

Figure 25:
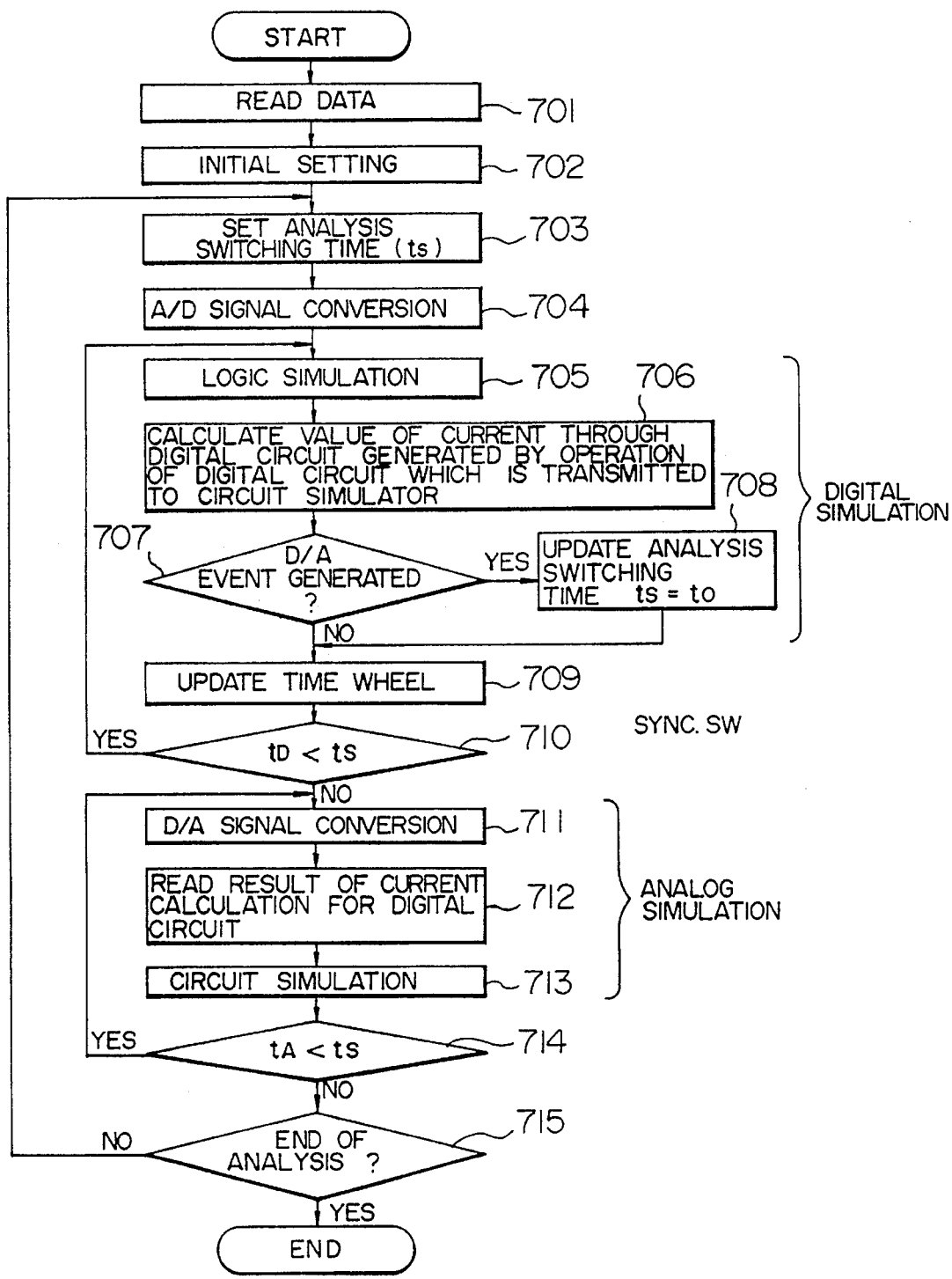
FIG. 25 is a flow chart illustrating a processing procedure of an example of mixed mode simulation where influence of current noise caused by the operation of a digital analyzed circuit portion is fed back through a power supply net to the characteristic of an analog analyzed circuit portion together with the synchronization control.

FIG. 25 illustrates a processing procedure of exemplary mixed mode simulation which feeds the influence of current noise due to the operation of the digital analysis circuit portion back to the characteristic of the analog analysis circuit portion through the power supply net, together with the foregoing synchronization control. The processing procedure shown in FIG. 25 is adapted to implement mixed mode simulation for the circuit illustrated in FIG. 26 which receives an input signal RIN by using the simulator synchronization control unit 4 to establish synchronization between the logic simulator 5 and the circuit simulator 6.

Figure 26:
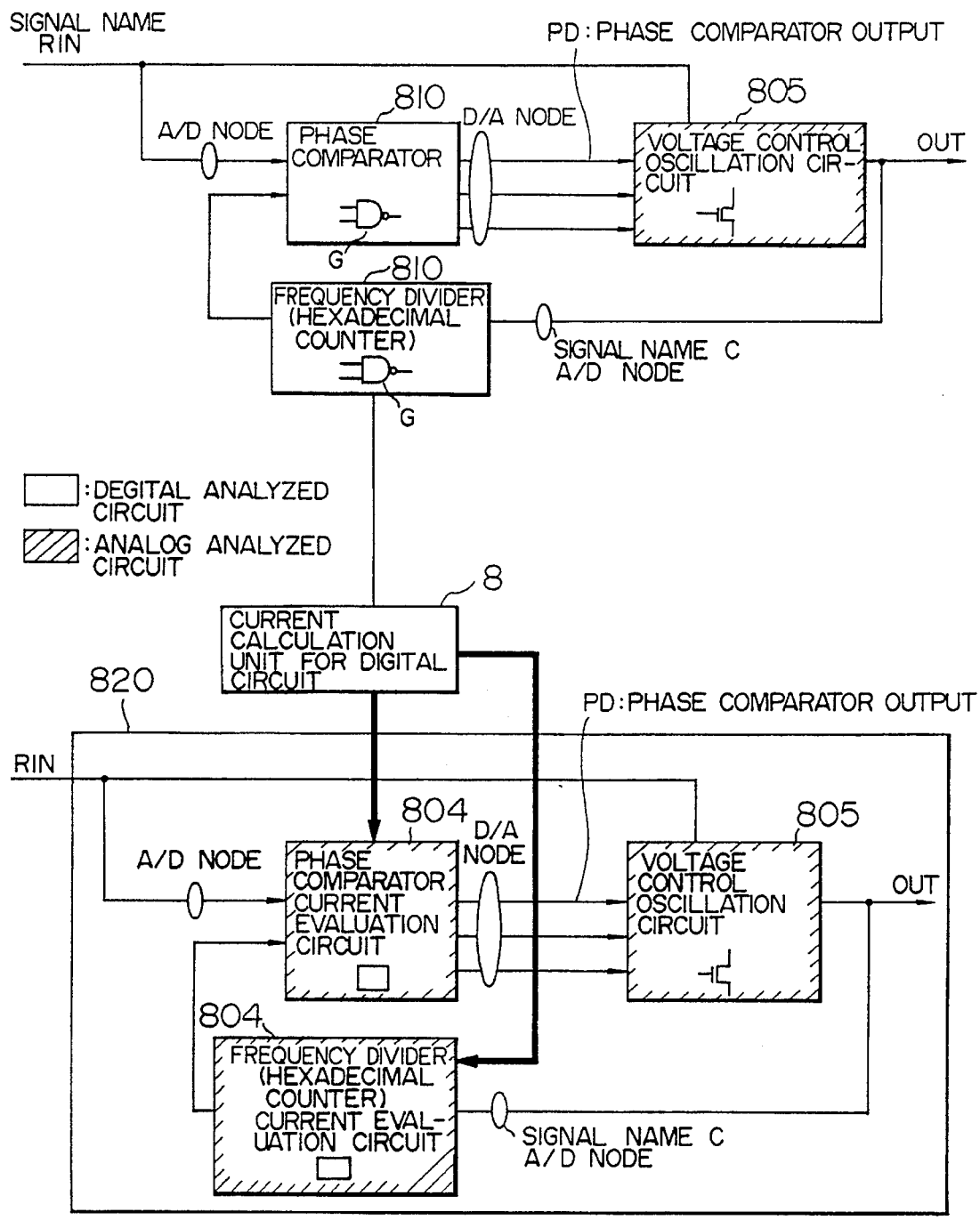
FIG. 26 is a diagram for explaining a composite circuit of an analog analyzed circuit portion and an equivalent circuit for current calculation in conformity with the explanation of FIG. 25.

(1) Upon reading data (step 701), data at logic level of a digital analyzed circuit portion 810 subjected to logic simulation and data at circuit level of a circuit simulation applied circuit 820 shown in FIG. 26 are read. The digital analyzed circuit portion 810 subjected to logical simulation executed by the logic simulator 5 includes a plurality of logic elements (digital circuit elements) G described as data at logic level. The circuit simulation applied circuit 820 subjected to circuit simulation executed by the circuit simulator 6 includes an analog circuit portion 805 and a current calculation equivalent circuit 804 constituting an equivalent circuit 810 for calculating a current through a digital circuit derived from the digital analyzed circuit portion 810. Although not limited particularly, the analog analyzed circuit portion 805 and the digital analyzed circuit portion 810 are constructed such that predetermined signals can be transferred between these circuit portions 810 and 805. Signals PD, C are typically shown in FIG. 26. As will be later described in detail, by modeling a current flowing through the digital analyzed circuit portion 810, the current calculation equivalent circuit 804 for the digital analyzed circuit portion 810 is formed. This current evaluation circuit 804 is then added to the analog analyzed circuit portion 805, whereby circuit simulation is executed by the circuit simulator 6 for a composite circuit composed of the current evaluation circuit 804 and the analog analysis circuit 805.

(2) In an initial setting processing (step 702), an initial value of an analysis time is set for each of the logic simulator 5 and the circuit simulator 6. For example, the analysis time of the logic simulator 5 is initially set to one unit time, while the analysis time of the circuit simulator 6 is initially set to zero second.

Figure 27:
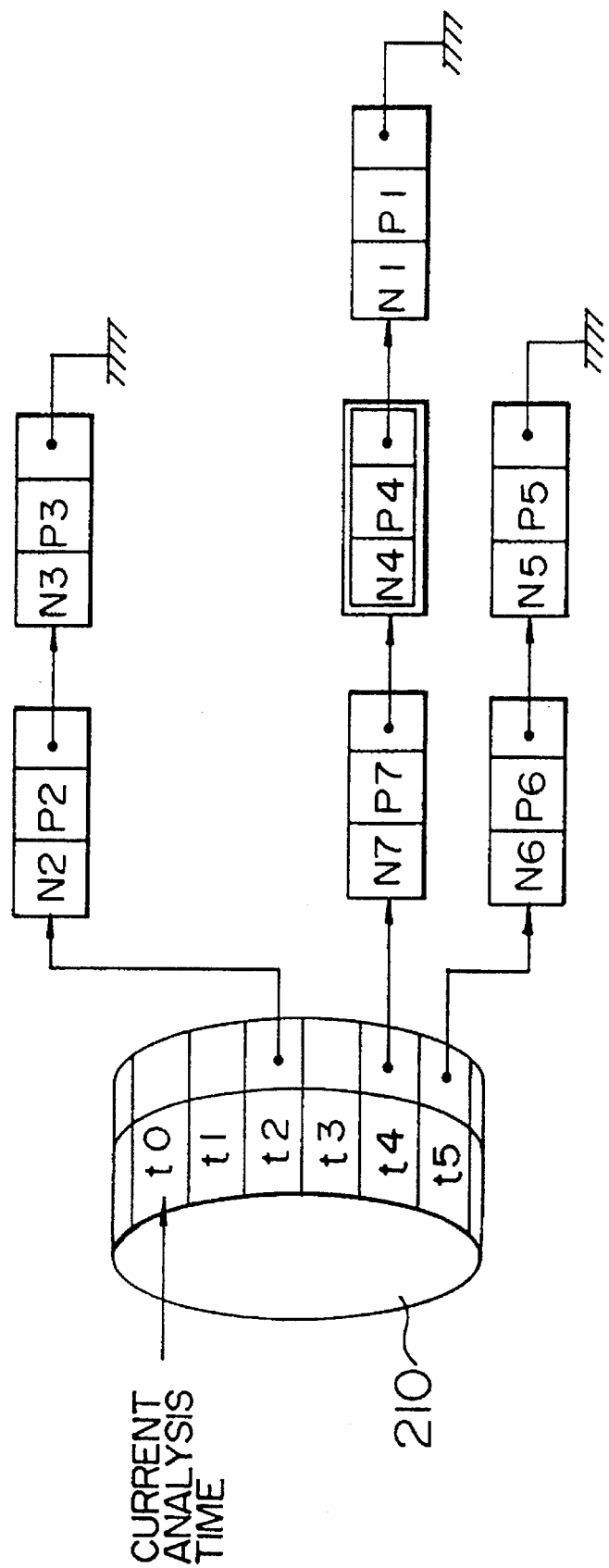
FIG. 27 is a diagram for explaining an example of the data structure used in a logic simulator in conformity with the explanation of FIG. 25.

(3) In an analysis switching time (ts) setting processing (step 703), time ts at which the logic simulator 5 is synchronized with the circuit simulator 6 is calculated. Specifically, calculated here is a time at which a next event appears within D/A nodes through which a signal is transferred from the digital analyzed circuit portion 810 to the analog analyzed circuit portion 805. An event generated while the logic simulator 5 is analyzing the digital analyzed circuit portion 810 is held in a data structure as shown in FIG. 27. For example, the earliest event on D/A nodes N4, N5 (PD) registered on a time wheel 210 is an event on the node N4 at time t4, in which case a time at which the next event appears on the D/A node is t4. Then, the next analysis time for the circuit simulator is calculated from the current time and a time step of the circuit simulator 6. The thus calculated time at which the next D/A event appears is compared with the next analysis scheduled time for the circuit simulator, and the earlier time is registered as the analysis switching time ts.

(4) The processing for A/D signal conversion, explained in connection with FIGS. 12 and 13, is executed at step 704. A signal converted by this processing is, for example, a signal transferred from the analog analyzed circuit portion 805 to the digital analyzed circuit portion 810.

(5) A processing in one unit time relative to logic simulation of the digital analyzed circuit portion 810 is executed from step 705 to step 710. At step 710, a current analysis time tD of the logic simulator 5 is monitored to check whether it is earlier than the analysis switching time ts. This monitoring allows the logic simulator 5 to execute logic simulation (step 705) until a unit time immediately before the analysis switching time ts.

(6) Every time one unit time of logic simulation is executed, a calculation processing is performed for calculating the value of a current flowing through the digital analyzed circuit portion 810 (step 706). This processing is provided for calculating the value of a current through the digital analyzed circuit portion 810 generated by the operation thereof, which should be transferred to the circuit simulator. Specifically, calculated here is a current value of a current source of a model, for example, as represented by the circuit model 142 for current calculation shown in FIG. 16.

Figure 28:
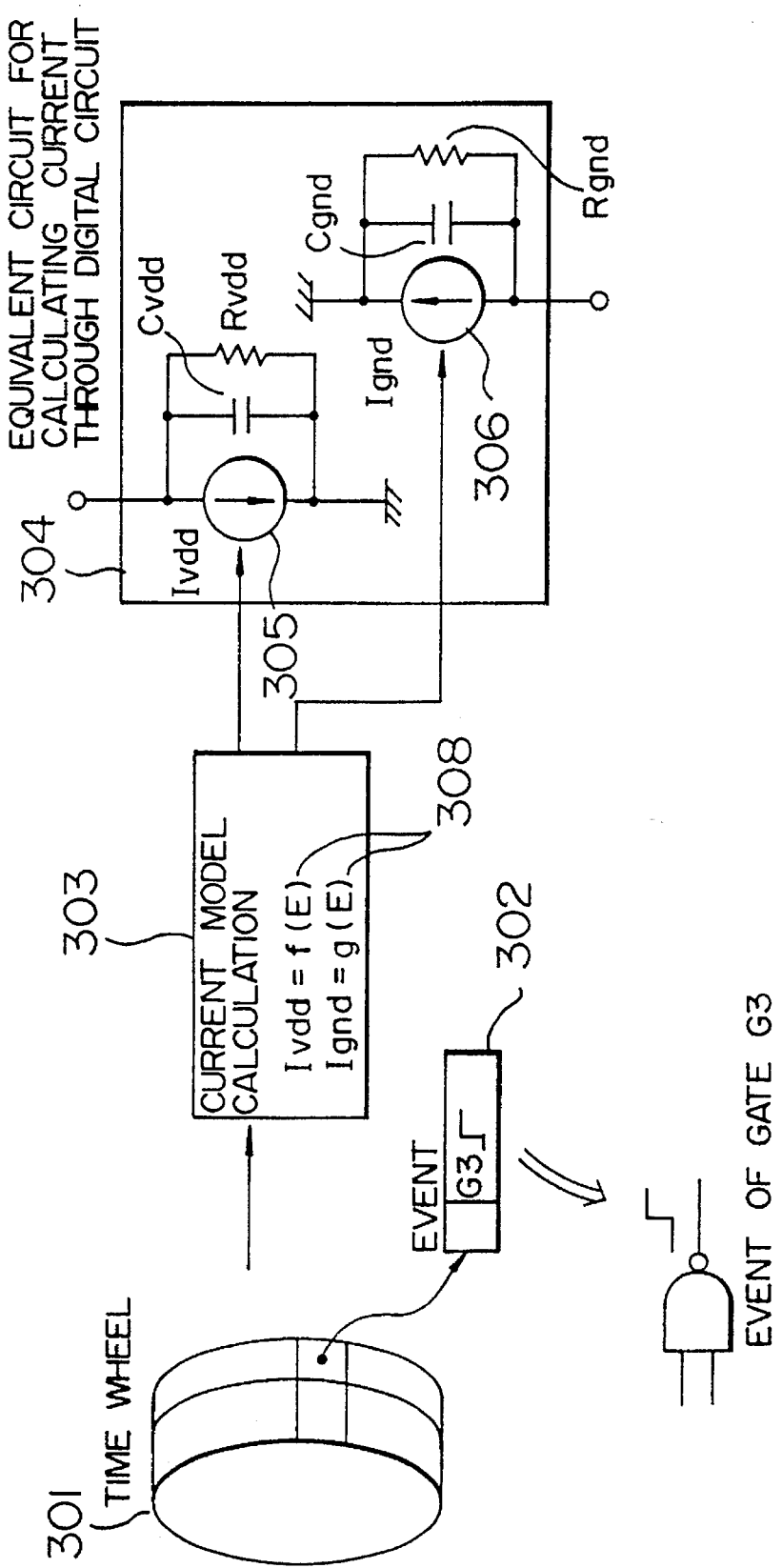
FIG. 28 is an explanatory diagram systematically illustrating an exemplary processing for setting a current value to a current source of a current model in a digital circuit on the basis of a logic element realized by the logic simulator.
Figure 29:
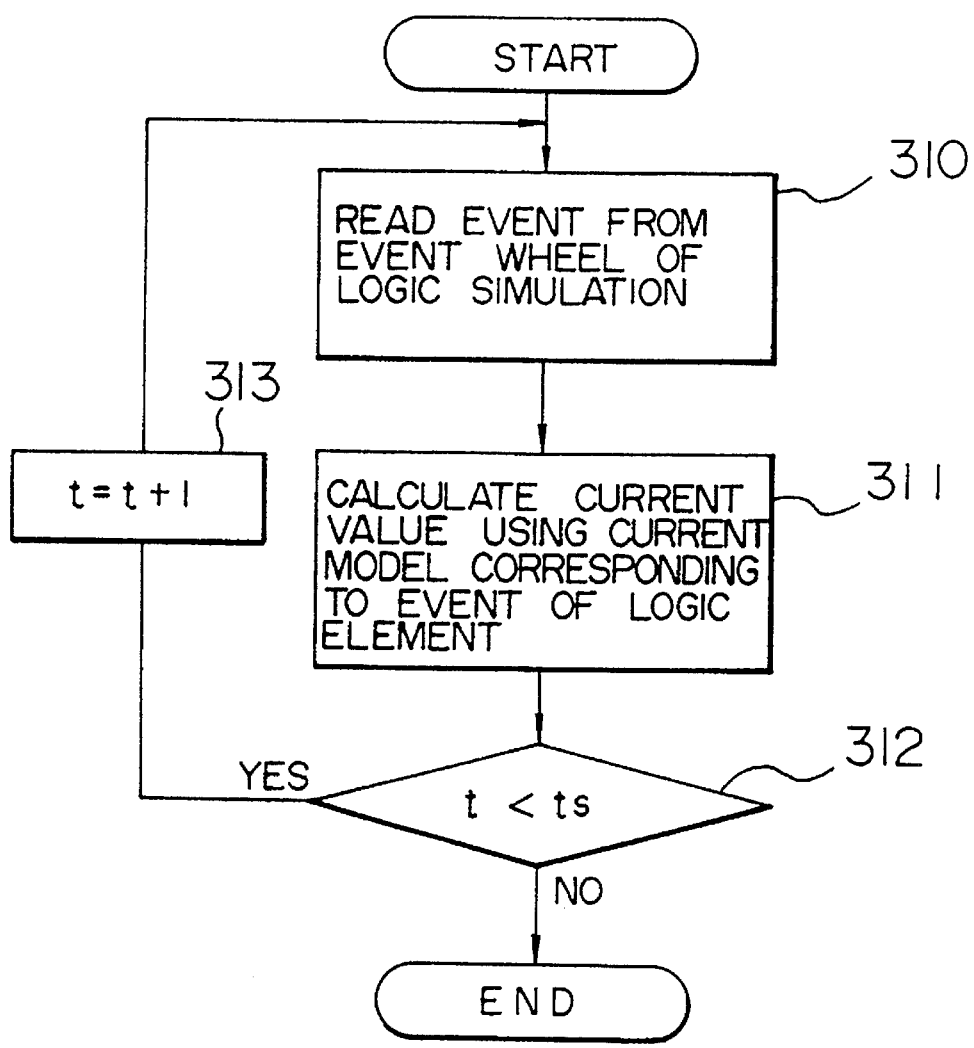
FIG. 29 is a flow chart illustrating an example of a current calculation processing procedure for an equivalent circuit for current calculation.

FIG. 28 illustrates a processing system for setting a current value to a current source in a current calculation equivalent circuit 304 in the digital analyzed circuit portion 810 on the basis of the operation of a logic element realized by the logic simulator 5, and FIG. 29 illustrates an example of a current calculation processing procedure performed by the current calculation equivalent circuit 304, i.e., the current evaluation circuit. The current value calculation processing in the above item (6) will be described in detail with reference to FIGS. 28 and 29. For example, an event 302 of a two-input NAND gate G3 registered on a time wheel 301 is read into a current calculation unit 303. This processing corresponds to step 310 in FIG. 29. The current calculation unit 303 uses a model 308 corresponding to an event of the two-input NAND gate G3 to calculate a current value of a power supply noise current source (Ivdd) 305 and a current value of a ground noise current source (Ignd) 306 in a current calculation equivalent circuit 304 of the digital analyzed circuit portion 810. The current model 308 calculates a current generated by an event as shown in FIG. 19D in accordance with a current model equation. At this time, a current generation timing and a current value are calculated with reference to FIG. 21. This processing corresponds to step 311 in FIG. 29. The calculation of a current value of the power supply noise current source Ivdd and a current value of the ground noise current source Ignd are performed for a logic simulation execution block as shown in steps 312 and 313 of FIG. 29. A variable E in an equation Ivdd=f(E) and Ignd=q(E) represents a current model parameter.

(7) When logic simulation is executed at step 705 of FIG. 25, it is determined whether or not a new D/A event has been generated earlier than the analysis switching time ts set at step 703 (step 708). If a new D/A event has been generated, an analysis time for the new D/A event is used to update the analysis switching time ts. The time wheel is sequentially updated at every time unit (step 709), and logic simulation is repeated through step 710 until a unit time immediately before the updated analysis switching time ts.

(8) Circuit simulation is executed through step 710 of FIG. 25 for a time period not exceeding the analysis time ts. A processing relative to the circuit simulation includes a sequence from step 711 to step 714. Specifically, at step 714, a current analysis time tA of the circuit simulation is monitored to check whether or not it exceeds the analysis switching time ts. With this monitoring, the circuit simulation is repeated for a time period not exceeding the analysis switching time ts. A signal to be transferred to the circuit simulator 6 by a D/A event of logic simulation is supplied to the circuit simulator 6 by performing at step 711 the processing for D/A signal conversion as explained above in connection with FIGS. 14 and 15. Further, the current value calculated at step 706 is read into the circuit simulator 6 (step 712). Thus, circuit simulation is executed for the current calculation equivalent circuit 804 including a current source having the set current value; the analog analysis circuit portion 805; and a D/A converted version of a signal supplied from the digital analysis circuit portion 810 as being objects of this simulation (step 713). In this circuit simulation, since fluctuation in a current consumed in the digital analyzed circuit portion 810 is reflected to the analog analyzed circuit portion 805 in real time, simulation can be accomplished for the total characteristics of the digital analyzed circuit portion 810 and the analog analyzed circuit portion 805. More specifically, the influence of current noise on a power supply line and a ground line due to the operation of the digital analyzed circuit portion 810 driven by an output signal C from the analog analyzed circuit portion 805 can be fed back to the characteristic of the analog analyzed circuit portion 805 through the power supply line and the ground line, thereby making it possible to evaluate highly accurate total characteristics of the analog analyzed circuit portion 805 and the digital analyzed circuit portion 810.

(9) The above logic simulation and circuit simulation are repeated through step 715 until the analysis is performed until the analysis end time.

The above described first embodiment produces the following effects:

(1) By executing analog simulation for a composite circuit composed of a current evaluation circuit as an analog component formed by modeling a current flowing through a digital analyzed circuit portion and an analog analyzed portion, fluctuation in a current consumed by the digital analyzed circuit portion can be reflected to the analog analyzed circuit portion in real time;

(2) The above processing enables the total characteristics of a digital analyzed circuit portion and an analog analyzed circuit portion to be simulated. It is also possible to verify the influence on the analog analyzed circuit portion exerted by current noise generated by the operation of the digital analyzed circuit portion in the mixed analog/digital circuit. Further, a current calculation of the digital analyzed circuit portion can also be realized by a circuit simulator.

(3) By employing a synchronization control wherein time at which synchronization is established between the logic simulator and the circuit simulator is determined from time at which a logic signal value of a node through which a signal is transferred from a digital analyzed circuit portion to an analog analyzed circuit portion is changed and a next analysis scheduled time of the circuit simulator, and simulation is advanced in a manner that logic simulation precedes circuit simulation, a time step need not be set to be narrow, and highly efficient mixed mode simulation can be realized. Further, since back track does not arise, useless calculation can also be reduced in circuit simulation.

(4) A current model representing a transient state of an output of a logic element is employed to obtain a timing of generating a recharging or discharging current on the output side of the logic element, thereby making it possible to readily detect a change in power supply current due a change in an output node of the logic element, i.e., the operation of the logic element.

(5) By calculating a current value by using a triangular wave approximated by polygonal lines, it is possible to readily perform current value calculation for a current source which is included in a circuit model for current calculation.

Next, a second embodiment of the present invention will be described with reference to FIGS. 30–34.

Figure 30:
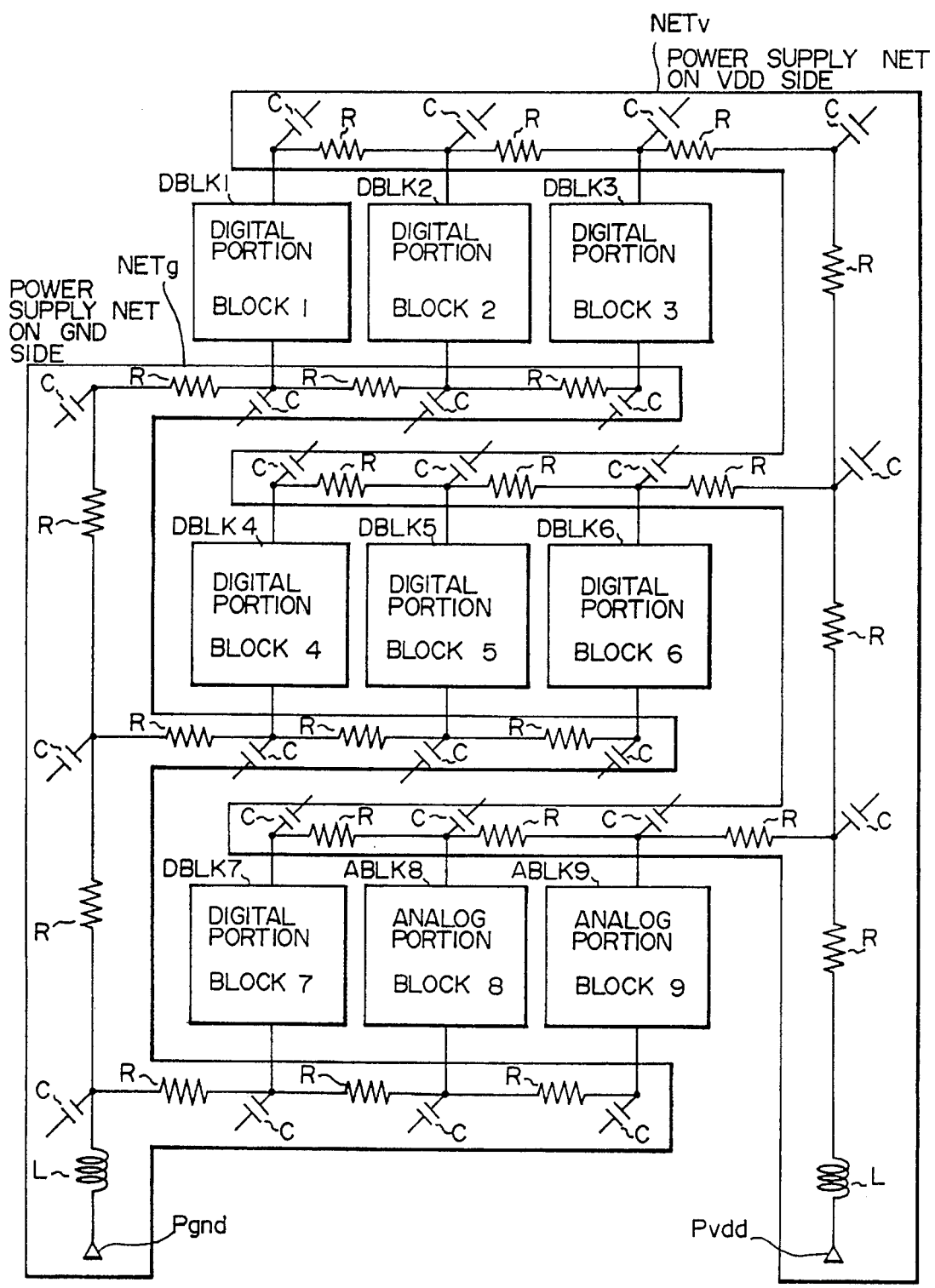
FIG. 30 is a diagram for explaining an example of conceptual partition of a circuit subjected to simulation in a second embodiment.

FIG. 30 conceptually illustrates, by way of example, how a circuit subjected to simulation is partitioned. Specifically, this example shows a one-chip semiconductor integrated circuit of analog/digital mixed type. This integrated circuit is divided into three portions, namely, a digital analyzed circuit portion subjected to logic simulation, an analog analyzed circuit portion subjected to circuit simulation, and a power supply net from a viewpoint of a power supply system for supplying electric power to the respective portions. The digital analyzed circuit portion is shown as further being divided into block DBLK1–block DBLK7. Also, the analog analyzed portion is shown as being divided into block ABLK8 and block ABLK9. Hereinafter, the blocks DBLK1–DBLK7 are also referred to as "the digital blocks", while the blocks ABLK8–ABLK9 as "the analog blocks." Incidentally, a graphical representation of signal transmission lines among these blocks is omitted in FIG. 30.

The digital blocks DBLK1–DBLK7 are blocks which may present at least either of logic values "1" and "0", wherein logic elements are collected as a group in view of signal flows and so on. For example, these blocks treat data for defining logic connections of logic elements, data specifying an input signal pattern, information on the type and delay of respective logic elements and so on as a group of logic level data described in a predetermined format for logic simulation. Although not limited in particular, this embodiment handles the digital block at gate level. The blocks treated at gate level presents, for example, "1", "0", undeterminable, and high impedance as signal values.

The analog blocks ABLK8 and ABLK9 are blocks which may present signal values in analog amount, wherein analog elements are collected as a group in view of signal flows and so on. For example, handled here is a group of data at circuit level including, for example, connection relationship among transistors, input signal waveforms, equivalent circuit models and electrical constants of transistors.

The power supply net comprises a GND side power supply net NETg and a VDD side power supply net NETv. In these power supply nets NETg and NETv, R represents a wiring resistance of power supply lines; C stray capacitance or parasitic capacitance existing between the power supply lines and a substrate or the like; L a parasitic inductance component existing in power supply terminals and bonding wires. These power supply nets NETg and NETv may be considered as a LRC equivalent circuit which is determined depending on a layout pattern of a semiconductor integrated circuit. Incidentally, in FIG. 30, Pvdd designates a power supply terminal for VDD, and Pgnd a power supply terminal for GND.

Figure 31:
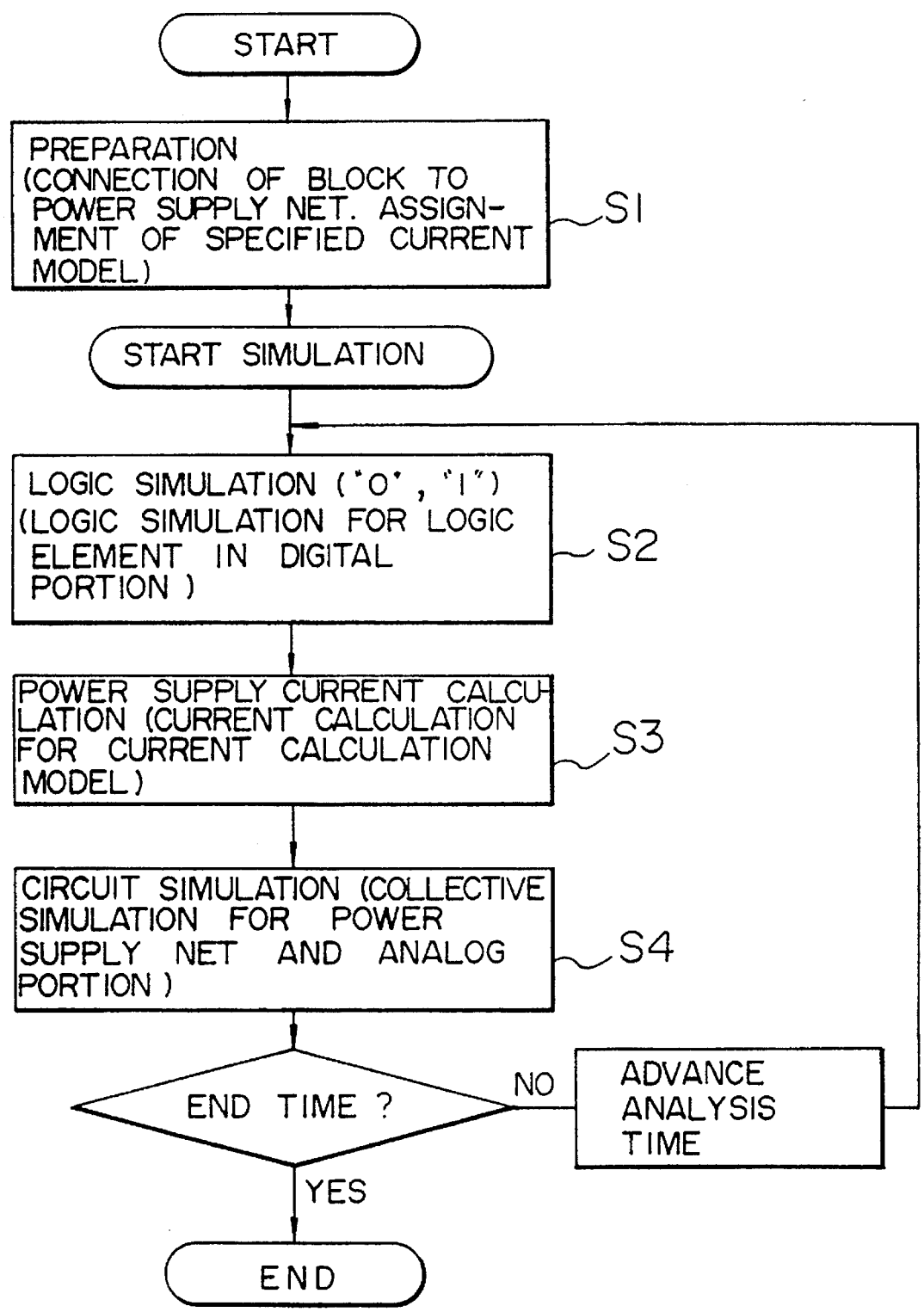
FIG. 31 is a flow chart illustrating an example of a simulation method according to the second embodiment which takes into account fluctuation in a power supply.

FIG. 31 illustrates a flow chart of a simulation method according to this embodiment which takes into account fluctuation in a power supply current due to the operation of the digital analyzed circuit portion. The simulation method shown in FIG. 31 includes the steps of preparation S1; logic simulation S2; power supply current calculation S3; and circuit simulation S4.

Figure 32:
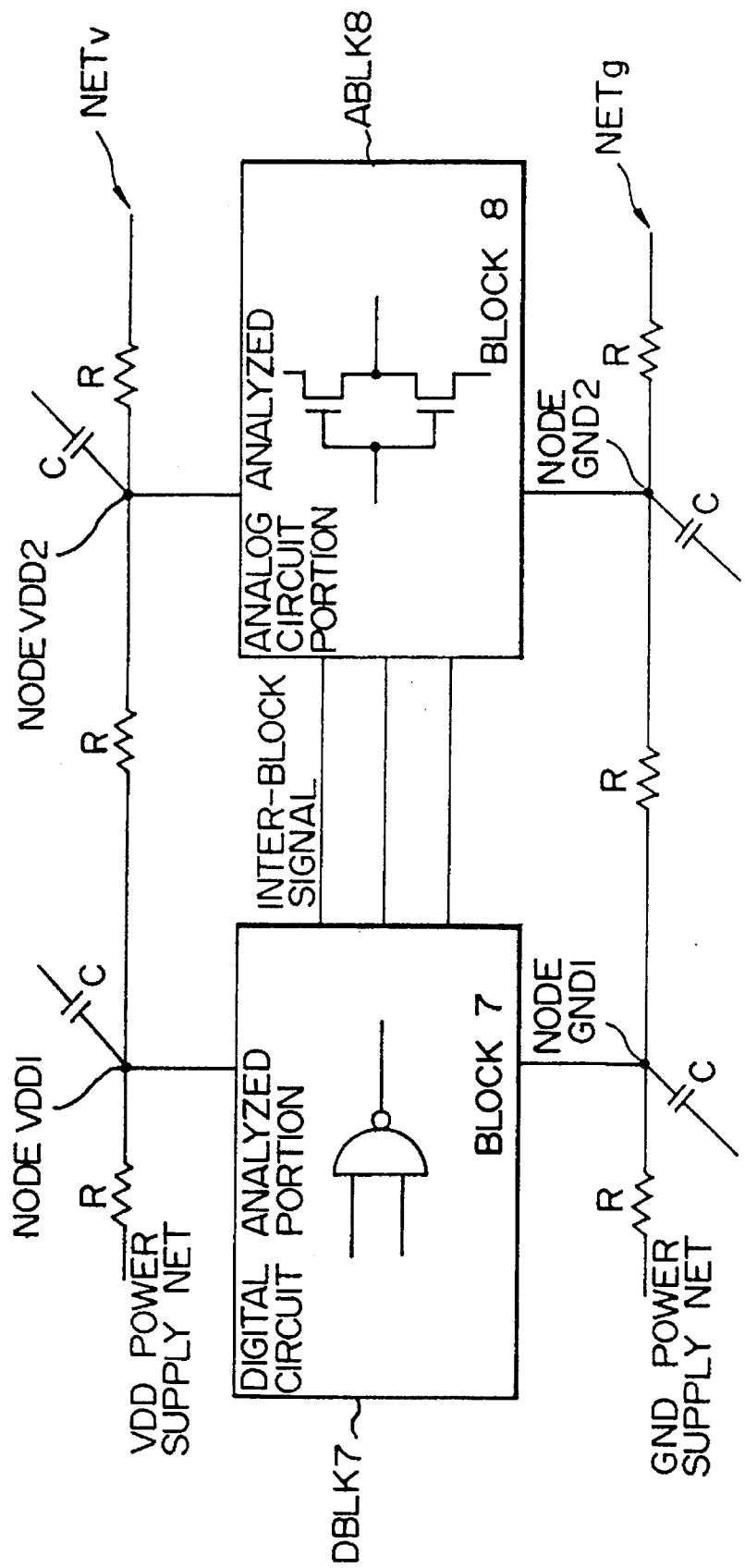
FIG. 32 is an explanatory diagram illustrating that a digital block and an analog block are connected to a power supply net as an example of information to be prepared at a previous step of the simulation shown in FIG. 31.

At the preparation step S1, information utilized for simulation is prepared. For example, information on the digital block DBLK7 and the analog block ABLK8, which are subjected to simulation, are prepared as shown in FIG. 32, and signals to be transferred mutually between these blocks are defined. Further, to which node of the power supply net each block is connected is specified, for example, by a node name.

Referring to FIG. 32, the digital block DBLK7 is coupled to a node VDD1 in the VDD side power supply net NETv as well as to a node GND1 in the GND side power supply net NETg. On the other hand, the analog block ABLK8 is coupled to a node VDD2 in the VDD side power supply net NETv as well as a node GND2 of the GND side power supply net NETg.

For the digital block prepared at the preparation step S1, a logic model whose output logic value is unitarily determined by an input logic value thereof and a current model which employs either one or a combination of the input logic value and the output logic value as a state variable to represent a state transition causing a change in a current through the logic block are assigned to logic elements included in the logic block. Such logic elements to which the current model is assigned include logic gates such as an invertor, NAND gate and NOR gate, combined circuits such as a gate composed of these logic gates, and sequential circuits serving as storage circuit such as flip-flop and register. As the logic model and the current model, those explained in connection with FIGS. 19C–19D may be given as examples.

A description of an input signal pattern prepared at the preparation step S1 and supplied to the digital block may be represented as a change in input logic value with respect to the time t, as indicated by the inputs IN1, IN2 of FIG. 20. When logic simulation is executed for a logic element such as a two-input NAND gate by means of the logic model, current model and input pattern, generating timings are derived for the output OUT in conformity with the logic model, for example, shown in FIG. 19C, and a recharging current (VDD side) or a discharging current (GND side) in conformity with a state transition of the current model shown in FIG. 19D. The results of the logic simulation such as the output of a logic element, the recharging or discharging time are held for each analysis unit.

At the power supply current calculation step S3, a current calculation is performed in synchronism with the recharging or discharging timing. This current calculation is provided to derive a recharging current or a discharging current of, for example, the load capacitor CL shown in FIG. 19B. Such a current calculation method may be implemented by a method which has previously explained on the basis of FIG. 21.

Figure 33:
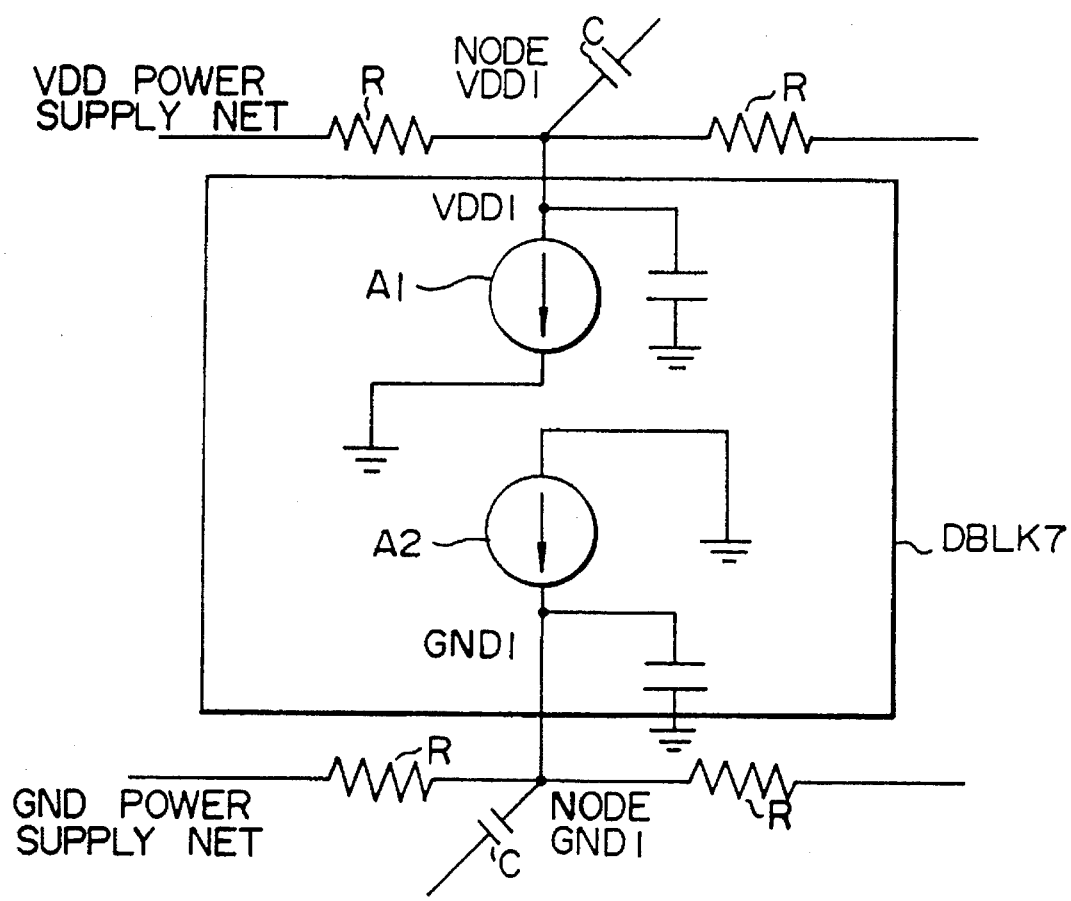
FIG. 33 is a diagram for explaining an example of a circuit model for current calculation in the second embodiment.

The currents thus calculated for respective logic elements are summed every time logic simulation performs analysis. The summed current is then modeled as current sources A1, A2 in the digital block as shown in FIG. 33. The current source A1 receives a current from the power supply VDD, while the current source A2 discharges a current to the power supply GND.

At the circuit simulation step S4, circuit simulation is executed for a composite circuit composed of the power supply nets NETv, NETg, the current sources A1, A2 and the analog block ABLK8. By designating such a composite circuit as an object of circuit simulation, it is possible to execute circuit simulation in consideration of power supply noise which is likely to be generated due to the operation of the digital block DBLK7.

The foregoing logic simulation, power supply current calculation and circuit simulation are repeated until the analysis time runs out.

Figure 34:
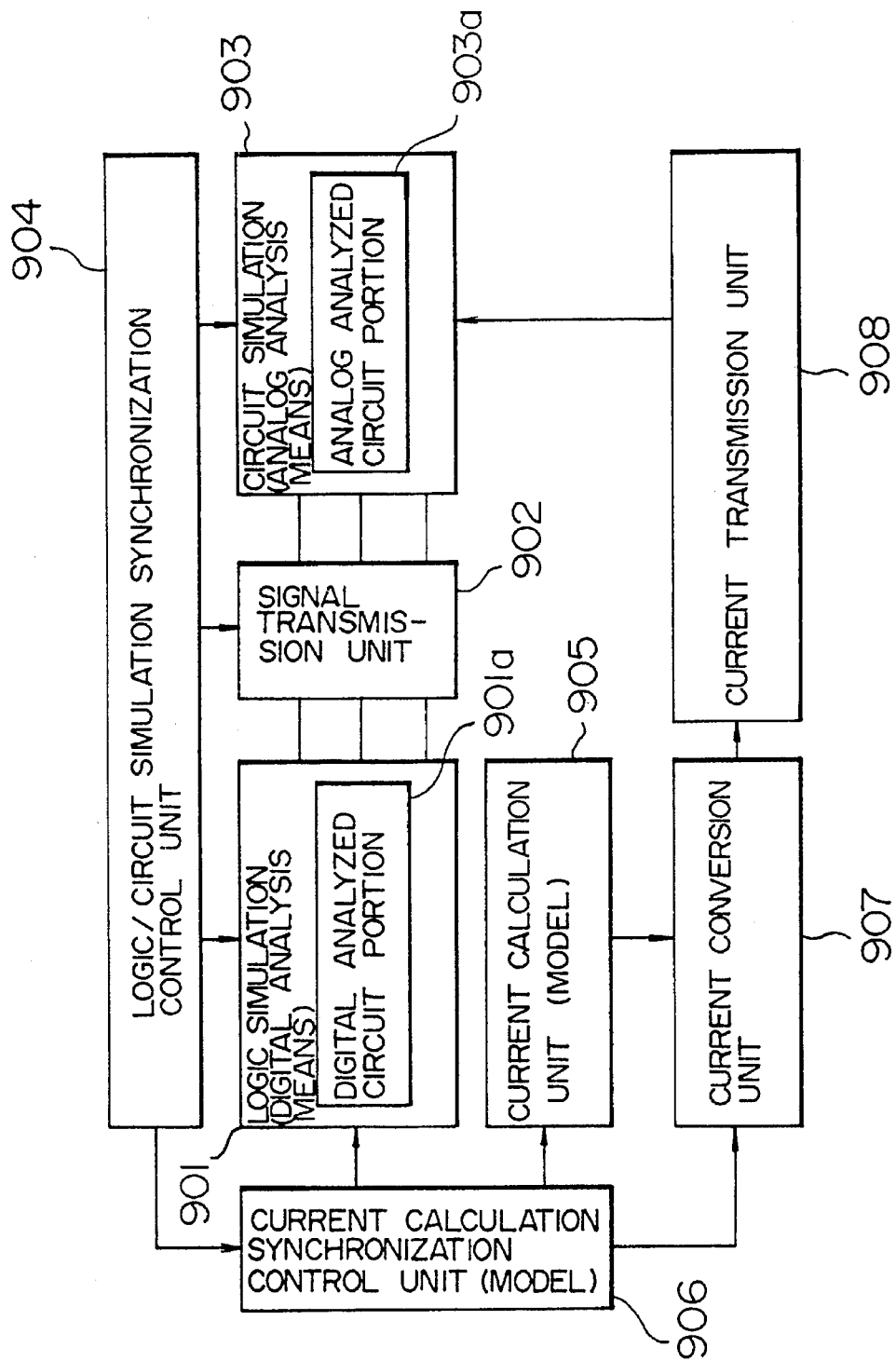
FIG. 34 is a functional block diagram illustrating an example of a simulator for realizing the simulation method of FIG. 31.

FIG. 34 illustrates in block representation an example of a simulator for realizing the foregoing simulation method. This simulator, though not limited in particular, is capable of verifying the operation of a mixed analog/digital circuit and comprises a logic simulation unit 901; a signal transmission unit 902; a circuit simulation unit 903; a logic/circuit simulation synchronization control unit 904; a current calculation unit 905 based on the model; a current calculation synchronization control unit 906 based on the model; an optional current conversion unit 907; and a power supply current transmission unit 908. These functional blocks are implemented respectively by a central processing unit; a work area in the central processing unit or RAM (random access memory) serving as a temporary storage area for data; an auxiliary storage unit; a man-machine interface such as a keyboard, display and so on; and operation programs for simulation.

The logic simulation unit 901 executes logic simulation for logic elements included in a digital analyzed circuit portion 901a in conformity with its logic model. The signal transmission unit 902 transmits signals between the logic simulation unit 901 and the circuit simulation unit 903 through a signal wiring model. The current calculation unit 905 calculates a current change, namely, a transient current which may arise in a logic element in synchronism with the logic simulation unit 901. The current calculation synchronization control unit 906 detects, in synchronism with the logic simulation operation, a current change which may arise in a logic gate, for example, a timing at which a recharging or discharging operation takes place in a capacitive loading, in conformity with the current model. Upon detecting a timing at which a recharging or discharging operation takes place, the current calculation synchronization control unit 906 instructs the current calculation unit 905 of calculating a power supply current. This calculation method employs, for example, the procedure that has been explained with reference to FIG. 21. The current conversion unit 907 selects information so as to neglect the value of a current calculated in the current calculation unit 905 below a predetermined threshold value which is thus prevented from being transmitted to the power supply current transmission unit 908. This current conversion unit 907, however, is not essential to this system and may be omitted. The power supply current transmission unit 908 transmits a transient current fed through the current conversion unit 907 to the circuit simulation unit 903. The circuit simulation unit 903 in turn executes circuit simulation for an analog block shown as the analog analyzed circuit portion 903a. In this event, a power supply noise model (current source and power supply net) provided from the power supply current transmission unit 908, and information on the results of logic simulation provided through the signal transmission unit 902 are also considered to be objects of the circuit simulation.

According to the second embodiment, a logic model and a current model are assigned to a logic element whose recharging or discharging current on the output side is calculated in synchronism with logic simulation for the logic model, and an equivalent circuit for current calculation is acquired in which a current source holding the calculated current is coupled to a predetermined node of a power supply net, thereby making it possible to predict fluctuation in a power supply voltage which may arise depending on an operating state of elements constituting a logic block, in synchronism with logic simulation for the logic block, namely, without executing circuit simulation for processing data described at transistor level. Therefore, even in the second embodiment which does not employ the synchronization control method as described with reference to FIGS. 22–24 of the first embodiment, by executing analog simulation for a composite circuit composed of an equivalent circuit for calculating a current as an analog component which is formed by modeling a current flowing through a digital analyzed circuit portion and an analog analyzed circuit portion, fluctuation in a current consumed by the digital analyzed circuit portion can be reflected to the analog analyzed circuit portion, in the same manner as the first embodiment. This feature permits simulation to be executed for the total characteristics of the digital analyzed circuit portion and the analog analyzed circuit portion as well as verification to be made on the influence on the analog analyzed circuit portion exerted by power supply noise generated due to the operation of the digital analyzed circuit portion in a mixed analog/digital circuit.

Further, by employing a current model representing a transient state of an output of a logic element to detect a timing of generating a recharging or discharging current on the output side of the logic element, it is possible to readily detect fluctuation in a power supply current due to a change in the output node of the logic element, i.e., the operation of the logic element. It is also possible to readily perform a current value calculation for a current source included in a circuit model for current calculation by calculating a current value with a triangle wave which is approximated by polygonal lines. In addition, when the current conversion unit 907 is employed so as to selectively apply the power supply net with currents above a predetermined threshold value from among those calculated by the current calculation unit 905, fluctuation in the power supply considered to exert substantially no influence is neglected to reduce burdens of the circuit simulation unit 903.

While the invention made by the present inventors has so far been specifically described on the basis of preferred embodiments, it goes without saying that the present invention is not limited thereto and various modifications may be made without departing from the gist thereof.

For example, although in the above embodiments, a current change arising due to the operation of a logic element is detected in accordance with a current model which is made in view of a transient state of the output of the logic element, such a change may be unitarily detected based on a change on an input node of the logic element. This may be a case, for example, of a logic element which produces a signal at complementary level which is inverted from a negative or positive input signal. Also, a current model which detects a current generating timing in accordance with a combination of input node and output node States of a logic element may be employed. Such a current model may be utilized in detecting a current generating timing, for example, for a sequential circuit such as flip-flop to allow the generating timing to be correctly detected.

Although in the foregoing embodiments, a current is actually calculated by the current calculation unit in synchronism with logic simulation, when a current waveform influenced by a given logic element has previously been known in simulation at transistor level of the logic element, a current value in a specified state may be taken from the previously known current data in synchronism with a changing timing of an output node of the logic element, thereby making it also possible to substitute relevant known current data for the current calculation.

Also, no matter how small a summed current value is, a current source may be assigned to the current value to reflect to circuit simulation.

While the foregoing embodiments have been explained for the case where logic simulation and circuit simulation are collectively executed, the technique of the present invention may be utilized for evaluating power supply noise caused by the operation of a digital circuit portion alone. Specifically, logic simulation is executed for a digital block, and when a logic operation of a logic element arises, a power supply current is calculated in synchronism with the logic operation. A peak value of the power supply current can be derived by performing this processing for a predetermined analysis time. By applying this peak value to a power supply system such as a power supply net, it is possible to predict power supply noise which may cause the VDD level to fall and the GND level to rise.

The logic simulation is not limited to simulation at gate level but may be logic simulation at register transfer level and function description level.

While the above explanation has been given mainly of a case where the present invention made by the present inventors is applied to simulation for a semiconductor integrated circuit of mixed analog/digital type which is a background utilization field thereof, the present invention is not limited thereto but widely applicable also to simulation for a semiconductor integrated circuit which operates exclusively in digital manner as well as a circuit formed on a printed circuit board other than a semiconductor substrate. Specifically, the present invention can be applied to memory LSIs such as video RAM and dynamic RAM as well as a variety of semiconductor integrated circuits such as logic LSIs including microcomputers. The purpose of simulation is neither limited to collective simulation for a mixed analog/digital circuit, and of course applicable to evaluation of power supply noise margin, evaluation of delay and malfunctions due to power supply noise, and so on.

Thus, the present invention is widely applicable to simulation techniques for monitoring a current change caused by an operation state of a logic element associated with at least logic simulation.

Representative effects produced by the invention disclosed in the present application may be summarized as follows:

By executing analog simulation for a composite circuit composed of an equivalent circuit for calculating a current as an analog component formed by modeling a current flowing through a digital analyzed circuit portion and an analog analyzed circuit portion, fluctuation in a current consumed by the digital analyzed circuit portion can be reflected to the analog analyzed circuit portion in real time.

This feature permits simulation to be executed for the total characteristics of a digital analyzed circuit portion and an analog analyzed circuit portion. It is also possible to verify the influence on the analog analyzed circuit portion exerted by power supply noise which is generated by the operation of the digital analyzed circuit portion in a mixed analog/digital circuit. A current calculation for a digital circuit can also be realized by a circuit simulator.

By employing a synchronization control scheme, wherein a time at which a logic simulator is synchronized with a circuit simulator is determined from a time at which a logic signal value changes at a node through which a signal is transferred from a digital analyzed circuit portion to an analog analyzed circuit portion and a next analysis scheduled time of the circuit simulator, and simulation is advanced such that the logic simulator precedes the circuit simulator, a time step need not be extremely narrow in the circuit simulation, highly efficient mixed mode simulation can be realized, and useless calculation can be reduced from the circuit simulation since back track does not arise.

Since a current model representing a transient state of an output of a logic element is employed to detect a timing of generating a recharging or discharging current on the output side of the logic element, a change in the output node of the logic element, that is, a change in power supply current due to the logic element can be detected easily. Further, by calculating a current value with a triangle waveform approximated by polygonal lines, calculation can be readily performed for the value of a current generated by a current source which is included in a circuit model for current calculation.

What is claimed is:

1. A mixed mode simulation method for mixedly executing logic simulation and circuit simulation so as to enable verification to be made for a noise current influence which is exerted to an analogy analyzed circuit portion realized by circuit simulation caused by a digital analyzed circuit portion realized by logic simulation, said method comprising:

a first step of determining an analog component in a generated output due to an operating state of the digital analyzed circuit portion which is subjected to said logic simulation in synchronism with a logic operation of the digital analyzed circuit portion realized by said logic simulation, said analog component comprising an equivalent circuit for noise current calculation which is modeled for applying said analog analyzed circuit portion with a noise current generated in accordance with an operating state of said digital analyzed circuit portion; and the second step of forming the analog component determined by said first step with an equivalent circuit including a current source component to realize said analog component, and adding said equivalent circuit to said analog analyzed circuit portion subjected to said circuit simulation to execute said circuit simulation.

2. A mixed mode simulation method according to claim 1, wherein said first step for determining a state of an analog component includes calculating a current value for the current source component included said equivalent circuit for current calculation.

3. A mixed mode simulation method according to claim 2, wherein said circuit simulation at said second step is performed for a composite circuit composed of said equivalent circuit having a determined current value of said current source component and said analog analyzed circuit portion which are coupled by a power supply wiring component.

4. A mixed mode simulation method for mixedly executing logic simulation and circuit simulation so as to enable verification to be made for a noise current which is exerted to an analogy analyzed circuit portion realized by circuit simulation by a state of a digital analyzed circuit portion realized by logic simulation, said method comprising the steps of:

setting an analysis switching time based on the earlier one of (1) a next scheduled time at which a signal is to be transferred from a circuit portion subjected to logic simulation to a circuit portion subjected to circuit simulation and (2) a scheduled time at which circuit simulation is to be next executed;

generating control information for an equivalent circuit which includes a current source for simulating the noise current through said digital analyzed circuit portion on the basis of logic simulation and an operating state of said digital analyzed circuit portion realized by said logic simulation until the set analysis switching time;

executing a noise circuit simulation for a composite circuit composed of said equivalent circuit for current calculation fed with said control information and said analog analyzed circuit portion; and repeating the above steps to synchronously advance circuit simulation and logic simulation.

5. A mixed mode simulation method according to claim 4, wherein if a time earlier than said analysis switching time is present as a next scheduled time at which a signal is to be transferred from a circuit portion subjected to logic simulation to a circuit portion subjected to circuit simulation while executing said logic simulation, the newly present scheduled time is set as a new analysis switching time.

6. A mixed mode simulation method according to claim 5, wherein said equivalent circuit generates a current source component which is modeled to provide said analog analyzed circuit portion with the noise current which is generated in accordance with an operating state of said digital analyzed circuit portion.

7. A mixed mode simulation method for enabling verification to be made for the influence which is exerted on an analogy analyzed circuit portion realized by circuit simulation by a state of a digital analyzed circuit portion realized by logic simulation, said method comprising the steps of:

assigning, to a logic element in the digital analyzed circuit portion, a logic model of a logic element whose output logic value is unitarily determined by a logic value inputted thereto and a current model which represents a state transition causing a change in current flowing through the logic model with a state variable being either of or a combination of the input logic value and the output logic value;

executing logic simulation based on the logic model assigned to said logic element;

calculating the value of a transient current generated by a change in the output of said logic element, based on the current model assigned to said logic element, in synchronism with said logic simulation; and providing said transient current value to a power supply net which models a power supply wiring system to which said logic element is connected, and executing circuit simulation for a circuit portion composed of said power supply net and an analog analyzed circuit portion.

8. A mixed mode simulation method according to claim 7, further comprising providing said power supply net only with a transient current above a predetermined threshold value.

9. A mixed mode simulation method according to claim 7, wherein a transient current is calculated in synchronism with said transient current generating timing on the basis of an output waveform of the logic element based on said current model which is represented by a waveform approximated by a polygonal line or a curve.

10. A mixed mode simulation apparatus for mixedly executing logic simulation and circuit simulation so as to enable verification to be made for an influence of a noise current exerted by a state of a digital analyzed circuit portion realized by logic simulation on an analog analyzed circuit portion realized by circuit simulation, said apparatus comprising:

means for executing logic simulation;

determination means for determining an equivalent circuit for current calculation which is modeled for applying said analog analyzed circuit portion with a noise current generated in accordance with an operating state of said digital analyzed circuit portion, said equivalent circuit including a current source component generated due to an operating state of the digital analyzed circuit portion which is subjected to said logic simulation executed by said means, in synchronism with a logic operation of the digital analyzed circuit portion realized by said logic simulation;

means coupled to the output of said determination means for forming said equivalent circuit for realizing the determined analog component in accordance therewith;

means for coupling the output of said equivalent circuit forming means to said analog analyzed circuit portion to form a composite circuit; and simulation means for executing circuit simulation for said composite circuit.

11. A mixed mode simulation apparatus according to claim 10, wherein said determination means includes calculation means for calculating a current value for the current source component included said equivalent circuit for current calculation.

12. A mixed mode simulation apparatus according to claim 11, wherein said said composite circuit forming means includes means for coupling said equivalent circuit having a determined current value of said current source component and said analog analyzed circuit portion through a power supply wiring component to constitute a composite circuit as a circuit portion subjected to circuit simulation.

13. A mixed mode simulation system for mixedly executing logic simulation and analog simulation so as to enable verification to be made for an influence of noise exerted by a state of a digital analyzed circuit portion realized by logic simulation on an analog analyzed circuit portion realized by circuit simulation, the simulation system comprising:

switching time setting means for setting an analysis switching time based on the earlier one of a next scheduled time at which a signal is to be transferred from a circuit portion subjected to logic simulation to a circuit portion subjected to circuit simulation and a scheduled time at which circuit simulation is to be next executed;

generation means for generating control information for an equivalent circuit for calculating a noise current through said digital analyzed circuit portion on the basis of logic simulation and an operating state of said digital analyzed circuit portion realized by said logic simulation until the analysis switching time set by said setting means, said equivalent circuit including a current source component which is modeled for providing said analog analyzed circuit portion with a noise current which is generated in accordance with an operating state of said digital analyzed circuit portion;

circuit simulation execution means responsive to the output of said generation means for executing circuit simulation for a composite circuit composed of said equivalent circuit and said analog analyzed circuit portion; and control means for controlling said setting means, said generation means and said execution means and repeating the processing of said each means to synchronously advance circuit simulation and logic simulation.

14. A mixed mode simulation system according to claim 13, further comprising update setting means for setting, if a time earlier than said analysis switching time is present as a next scheduled time at which a signal is to be transferred from a circuit portion subjected to logic simulation to a circuit portion subjected to circuit simulation while executing said logic simulation, the newly present scheduled time is set as a new analysis switching time.

15. A mixed mode simulation system for enabling verification to be made for the influence of power consumption which is exerted by a state of a digital analyzed circuit portion realized by logic simulation on an analogy analyzed circuit portion realized by circuit simulation, the simulation system comprising:

an assignment table for assigning, to a logic element in a logic analyzed circuit portion, a logic model of a logic element whose output logic value is unitarily determined by a logic value inputted thereto and a current model which represents a state transition attributable to power consumption causing a change in current flowing through the logic model with a state variable being either of or a combination of the input logic value and the output logic value;

logic simulation execution means for executing logic simulation based on the logic model assigned to said logic element;

calculation means for calculating the value of a transient power consumption current generated by a change in the output of said logic element, based on the current model assigned to said logic element, in synchronism with said logic simulation; and circuit simulation execution means coupled to said calculation means for providing said transient power consumption current value to a power supply net which models a power supply wiring system to which said logic element is connected, the power supply net including a modeled power consumption current element, the circuit simulation execution means executing circuit simulation for a composite circuit composed of said power supply net and an analog analyzed circuit portion.

16. A mixed mode simulation system according to claim 15, further comprising means for providing said power supply net only with a transient current above a predetermined threshold value.

17. A mixed mode simulation system for enabling verification to be made for a transient current influence which is exerted by a state of a digital analyzed circuit portion realized by logic simulation on an analogy analyzed circuit portion realized by circuit simulation, the simulation system comprising:

an assignment table for assigning, to a logic element in a logic analyzed circuit portion, a logic model of a logic element whose output logic value is unitarily determined by a logic value inputted thereto and a current model which represents a state transition causing a transient change in current flowing through the logic model with a state variable being either of or a combination of the input logic value and the output logic value;

logic simulation execution means for executing logic simulation based on the logic model assigned to said logic element;

calculation means for calculating the value of a transient current generated by a transient change in the output of said logic element, based on the current model assigned to said logic element, in synchronism with said logic simulation;

circuit simulation execution means coupled to said calculation means for providing said transient current value to a power supply net which models a power supply wiring system to which said logic element is connected, and executing circuit simulation for a composite circuit composed of said power supply net and an analog analyzed circuit portion; and calculation means for calculating the transient current in synchronism with said transient current generating timing on the basis of an output waveform of the logic element based on said current model which is represented by a waveform approximated by a polygonal line or a curve.

\* \* \* \* \*